United States Patent
Underwood et al.

(10) Patent No.: US 12,407,340 B2
(45) Date of Patent: Sep. 2, 2025

(54) FLUX CONTROL ARCHITECTURE FOR 1ST ORDER NOISE INSENSITIVITY

(71) Applicant: International Business Machines Corporation, Armonk, NY (US)

(72) Inventors: Devin Underwood, Bronx, NY (US); Jiri Stehlik, New York, NY (US); David James Frank, Yorktown Heights, NY (US); Timothy Phung, Milpitas, CA (US); David Zajac, Valley Cottage, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 947 days.

(21) Appl. No.: 17/538,013

(22) Filed: Nov. 30, 2021

(65) Prior Publication Data
US 2023/0170889 A1   Jun. 1, 2023

(51) Int. Cl.
*H03K 5/1252* (2006.01)
*G06N 10/40* (2022.01)

(52) U.S. Cl.
CPC ........... *H03K 5/1252* (2013.01); *G06N 10/40* (2022.01)

(58) Field of Classification Search
None
See application file for complete search history.

(56) References Cited

U.S. PATENT DOCUMENTS

| | | | |
|---|---|---|---|
| 10,374,612 B1 | 8/2019 | Sinclair et al. | |
| 10,483,980 B2 | 11/2019 | Sete et al. | |
| 10,650,323 B2 | 5/2020 | Esptein et al. | |
| 2009/0289638 A1* | 11/2009 | Farinelli | G06N 10/40 |
| | | | 257/E39.012 |
| 2014/0235450 A1* | 8/2014 | Chow | H01P 3/082 |
| | | | 324/633 |
| 2017/0193388 A1 | 7/2017 | Filipp et al. | |
| 2018/0054201 A1 | 2/2018 | Reagor et al. | |
| 2018/0261752 A1* | 9/2018 | Ferguson | H10N 60/805 |
| 2019/0007051 A1* | 1/2019 | Sete | H03K 19/195 |
| 2019/0156237 A1* | 5/2019 | Epstein | G06N 10/20 |
| 2020/0050961 A1 | 2/2020 | Abdo | |

(Continued)

FOREIGN PATENT DOCUMENTS

WO   2021/102321 A2   5/2021

OTHER PUBLICATIONS

Sete et al., "Charge- and Flux-Insensitive Tunable Superconducting Qubit," Physical Review Applied 8, 024004 (2017).*

(Continued)

*Primary Examiner* — Ryan Barrett
(74) *Attorney, Agent, or Firm* — Amin, Turocy & Watson, LLP

(57) ABSTRACT

One or more systems, devices, methods of use and/or methods of fabrication provided herein relate to a quantum computing device that can operated to have $1^{st}$ order insensitivity to flux noise. According to one embodiment, a device comprises a flux tunable qubit capacitively coupled to a flux tunable bus. According to another embodiment, a device comprises a flux tunable qubit capacitively coupled to a flux tunable bus, wherein the flux tunable bus is capacitively coupled a fixed frequency qubit.

20 Claims, 16 Drawing Sheets

(56) References Cited

U.S. PATENT DOCUMENTS

| | | | | |
|---|---|---|---|---|
| 2020/0320420 | A1* | 10/2020 | Hart | G06N 10/40 |
| 2021/0036206 | A1* | 2/2021 | Neill | H10N 60/805 |
| 2021/0350266 | A1* | 11/2021 | Hassel | G01R 33/0354 |
| 2021/0406746 | A1* | 12/2021 | Stehlik | G06N 10/70 |
| 2021/0408112 | A1* | 12/2021 | Finck | H03K 19/017545 |
| 2022/0059919 | A1* | 2/2022 | Underwood | G06N 10/00 |
| 2022/0138611 | A1* | 5/2022 | Siddiqi | G06N 10/20 |
| | | | | 716/100 |
| 2022/0222567 | A1* | 7/2022 | Reagor | G06N 10/40 |
| 2022/0374755 | A1* | 11/2022 | Didier | G06N 10/40 |
| 2023/0359919 | A1* | 11/2023 | Phung | G06N 10/40 |
| 2023/0368059 | A1* | 11/2023 | Mckay | G06N 10/20 |
| 2023/0394345 | A1* | 12/2023 | Mckay | G06N 10/40 |
| 2023/0401476 | A1* | 12/2023 | Finck | G06N 10/40 |

OTHER PUBLICATIONS

Brink et al., "Mediated Tunable Coupling of Flux Qubits," Oct. 13, 2005, https://arxiv.org/abs/cond-mat/0501148v2.*

Yan et al., "The Flux Qubit Revisited to Enhance Coherence and Reproducibility," Nov. 3, 2016, https://www.nature.com/articles/ncomms12964.*

Didier, N. | "Flux control of superconducting qubits at dynamical sweet spots". arXiv:1912.09416v1 [quant-ph] Dec. 19, 2019, 9 pages.

Dider, N. et al. | "AC Flux sweet spots in parametrically-modulated superconducting qubits". arXiv:1807.01310v2 [quant-ph] Jun. 26, 2019, 11 pages.

McKay, D. et al. | "A universal gate for fixed-frequency qubits via a tunable bus". Phys. Rev. Applied 6, 064007, arXiv:1604.03076v3 [quant-ph] Dec. 19, 2016, 10 pages.

Yan, F. | "Tunable Coupling Scheme for Implementing High-Fidelity Two-Qubit Gates". Phys. Rev. Applied 10, 054062, arXiv:1803.09813v1 [quant-ph] Mar. 26, 2018, 10 pages.

U.S. Appl. No. 16/910,286, filed Jun. 247, 2020 "Tunable Quantum Coupler Facilitating a Quantum Gate Between Qubits", P202001229, 58 pages.

International Search Report and Written Opinion received for PCT Application Serial No. PCT/EP2022/083742 dated Feb. 27, 2023, 12 pages.

Sete et al., "Parametric-resonance entangling gates with a tunable coupler", arxiv.org, Cornell University Library, 201 Olin Library Cornell University Ithaca, NY 14853, Sep. 7, 2021, 14 pages.

Xu et al., "ZZ Freedom in Two-Qubit Gates", Physical Review Applied, vol. 15, No. 6, Jun. 29, 2021, 13 pages.

* cited by examiner

FLUX CONTROL ARCHITECTURE FOR 1ST ORDER NOISE INSENSITIVITY

BACKGROUND

The subject disclosure relates to qubit frequency tuning, and more specifically to a control architecture to facilitate 1st order noise insensitivity in a qubit device.

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

However, the qubits used in quantum computing devices are susceptible to flux noise, background electronic radio interference which can lead to increased gate errors and decreased efficiency in existing qubit architectures. For a particular range or device parameters there exists a bias region in which qubits are 1st order in-sensitive to flux noise commonly referred to as the sweet spot. However, in existing qubit architectures it is difficult to fabricate qubits within the sweet spot due to imprecision and disorder in the fabrication process. This creates a problem in existing qubit devices which are susceptible to flux noise, and as a result, have slower gates and lower gate fidelities.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, and/or devices that facilitate flux control for $1^{st}$ order noise insensitivity.

According to an embodiment, a system can comprise a quantum computing device. The quantum computing device can comprise a flux tunable qubit capacitively coupled to a flux tunable bus. An advantage of such a system is that as both the flux tunable qubit and the flux tunable bus are tunable, the system has flexibility that is not present in fixed frequency qubit systems.

In some embodiments, the flux tunable bus can be capacitively coupled to a fixed frequency qubit. An advantage of such a system is that it allows for the fixed frequency qubit to act as a data qubit, storing data, and the flux tunable qubit to act as an ancilla qubit which can be used to read or write data to the fixed frequency qubit.

According to another embodiment, a method can comprise capacitively coupling a flux tunable qubit to a flux tunable bus. An advantage of such a system is that as both the flux tunable qubit and the flux tunable bus are tunable, the method allows for flexibility that is not present in fixed frequency qubit systems.

In some embodiments, the above method can further comprise, capacitively coupling the flux tunable bus to a fixed frequency qubit. An advantage of such a method is that it allows for the fixed frequency qubit to act as a data qubit, storing data, and the flux tunable qubit to act as an ancilla qubit which can be used to read or write data to the fixed frequency qubit.

According to another embodiment, a device can comprise a flux tunable qubit capacitively coupled to a flux tunable bus. An advantage of such a device is that as both the flux tunable qubit and the flux tunable bus are tunable, the device has flexibility that is not present in fixed frequency qubit devices.

In some embodiments, the program instructions are further executable by the processor to cause the processor to save a state of a last shared node of the first path of computation nodes and the second path of computation nodes. An advantage of such a device is that it allows for the fixed frequency qubit to act as a data qubit, storing data, and the flux tunable qubit to act as an ancilla qubit which can be used to read or write data to the fixed frequency qubit.

DETAILED DESCRIPTION

Figure 1:
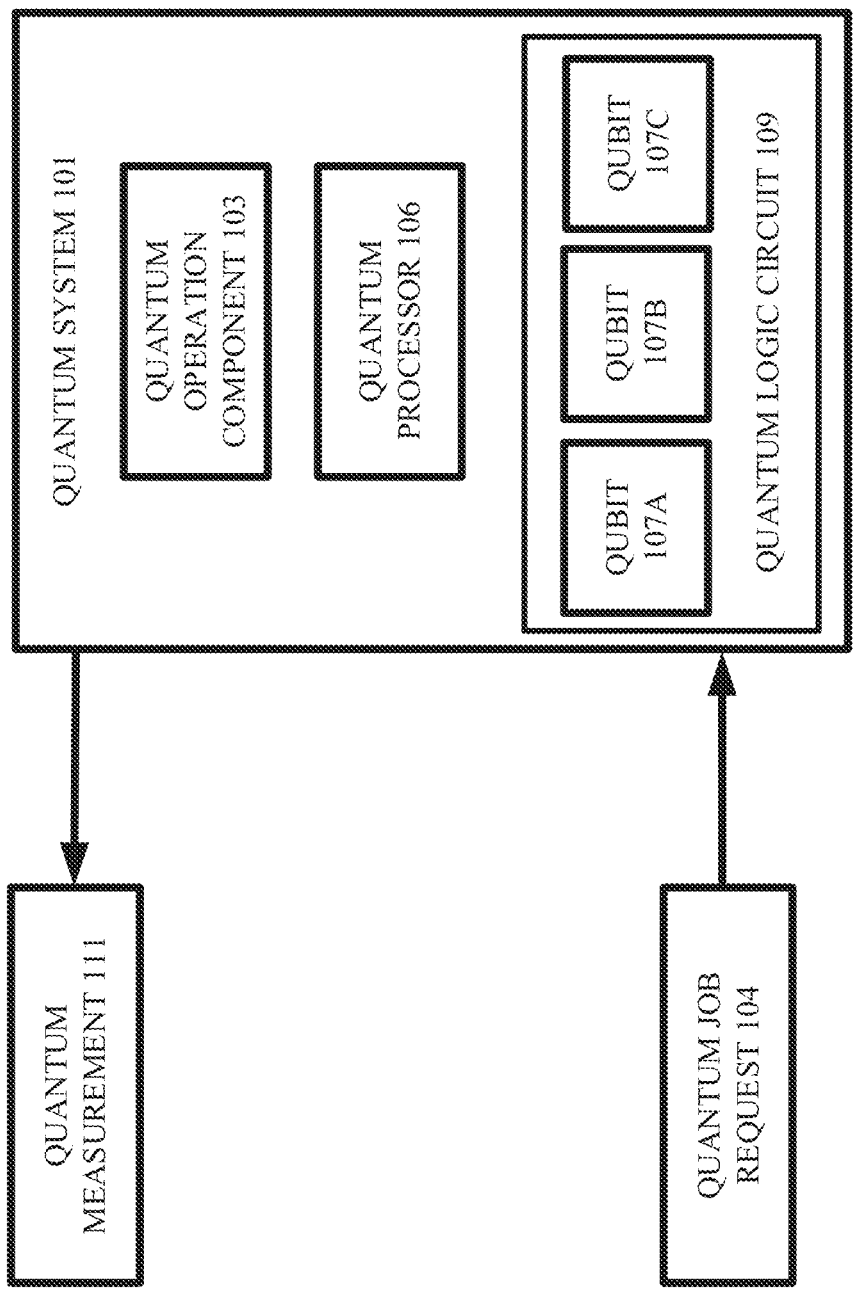
FIG. 1 illustrates a block diagram of an example, non-limiting system 100 that can enhance execution of a quantum job in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Quantum computation utilizes a qubit as its essential unit instead of a classical computing bit. A qubit (e.g., quantum binary digit) is a quantum-mechanical analog of a classical bit. Whereas classical bits can employ only one of two basis states (e.g., 0 or 1), qubits can employ superpositions of those basis states (e.g., $\alpha|0\rangle + \beta|1\rangle$, where $\alpha$ and $\beta$ are complex scalars (such that $|\alpha|^2 + |\beta|^2 = 1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits can occupy a superposition of 0 and 1 states. It is not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1.

However, quantum gates are susceptible to several forms of gate error, which can cause loss and/or corruption of data as well as increased computation time and decreased accuracy. For example, state dependent exchange ZZ (static ZZ) is an interaction between transmon devices coupled together and is influenced by the frequencies of the transmons. Therefore, a higher ZZ causes increased gate errors during the simultaneous operation of multiple gates. Another form of gate error, signal interference error also occurs during simultaneous operations of multiple gates. This occurs as multiple different pulses applied to a quantum system can create different amounts of entanglement between different parts of the system simultaneously, causing gate error. A third type of gate error results from the skin effect of the cables caused by long time scales in pulses applied to quantum systems. For example, if a long cable is used to transmit a pulse to a quantum system, the long cable can cause the pulse to stretch out, creating a situation where a first pulse has not settled before a second pulse is transmitted. Finally, flux noise error is error that occurs due to magnetic flux noise from control electronic or simply background magnetic flux that can cause changes in frequency of qubits, and thus error. These errors can be influenced by a large array of conditions such as flux bias offset, flux pulse amplitude, flux pulse shape, flux pulse width, buffer lengths, and single qubit gate parameters such as gate length and the detuning of, or the difference in frequency between, two qubits in a gate. In particular, detuning between two qubits can have a larger effect on gate error and speed, and thus selecting a particular detuning between qubits can have a large impact on decreasing gate error.

A fixed frequency qubit is one that operates a set frequency, determined and implemented during the fabrication of the fixed frequency qubit. As noted above, due to imprecision in the manufacturing process it is difficult to manufacture fixed frequency qubits at precise frequencies. This has a large impact on gate error, as it is difficult to create fixed frequency qubit pairs with specific detuning to lower gate error. As an alternative to fixed frequency qubits, flux tunable qubits are qubits which have a frequency range and can be biased to a region or point within that frequency range through the application of a flux pulse.

Given the problems described above with existing quantum device architectures, the present disclosure can be implemented to produce a solution to these problems in the form of systems, methods, and/or devices that can facilitate flux control for Pt order noise insensitivity by: capacitively coupling a flux tunable qubit to a flux tunable bus. An advantage of such systems, methods, and/or devices is that they can be implemented to allow for greater reduction of noise sensitivity due to the ability to be tuned to certain frequencies through the use of flux pulses.

In some embodiments, the present disclosure can be implemented to produce a solution to the problems described above in the form of systems, devices, apparatuses, and/or methods, that can further facilitate flux control for Pt order noise insensitivity by: capacitively coupling the flux tunable bus to a fixed frequency qubit. An advantage of such systems, methods, and/or devices is that it allows for the fixed frequency qubit to act as a data qubit, storing data, and the flux tunable qubit to act as an ancilla qubit which can be used to read or write data to the fixed frequency qubit.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. It is evident, however, in various cases, that the one or more embodiments can be practiced without these specific details.

Further, it will be appreciated that the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIG. 1, and/or systems thereof, can further comprise one or more computer and/or computing-based elements described herein with reference to an operating environment, such as the operating environment 1600 illustrated at FIG. 16. In one or more described embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more devices, systems and/or apparatuses that can facilitate executing one or more quantum operations to facilitate output of one or more quantum results. For example, FIG. 1 illustrates a block diagram of an example, non-limiting system 100 that can enhance execution of a quantum job.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 111, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106 and a quantum logic circuit 109 comprising one or more qubits (e.g., qubits 107A, 107B and/or 107C), also referred to herein as qubit devices 107A, 107B and 107C. The quantum processor 106 can be any suitable processor, such as being capable of controlling qubit coherence and the like. The quantum processor 106 can generate one or more instructions for controlling the one or more processes of the quantum operation component 103.

The quantum operation component 103 that can obtain (e.g., download, receive, search for and/or the like) a quantum job request 104 requesting execution of one or more quantum programs. The quantum operation component 103 can determine one or more quantum logic circuits, such as the quantum logic circuit 109, for executing the quantum program. The request 104 can be provided in any suitable format, such as a text format, binary format and/or another suitable format. In one or more embodiments, the request 104 can be received by a component other than a component of the quantum system 101, such as by a component of a classical system coupled to and/or in communication with the quantum system 101.

The quantum operation component 103 can perform one or more quantum processes, calculations and/or measurements for operating one or more quantum circuits on the one or more qubits 107A, 107B and/or 107C. For example, the quantum operation component 103 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. That is, the quantum operation component 103, such as in combination with the quantum processor 106, can execute operation of a quantum logic circuit on one or more qubits of the circuit (e.g., qubit 107A, 107B and/or 107C). The quantum operation component 103 can output one or more quantum job results, such as one or more quantum measurements 111, in response to the quantum job request 104.

It will be appreciated that the following description(s) refer(s) to the operation of a single quantum program from a single quantum job request. However, it also will be appreciated that one or more of the processes described herein can be scalable, such as execution of one or more quantum programs and/or quantum job requests in parallel with one another.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
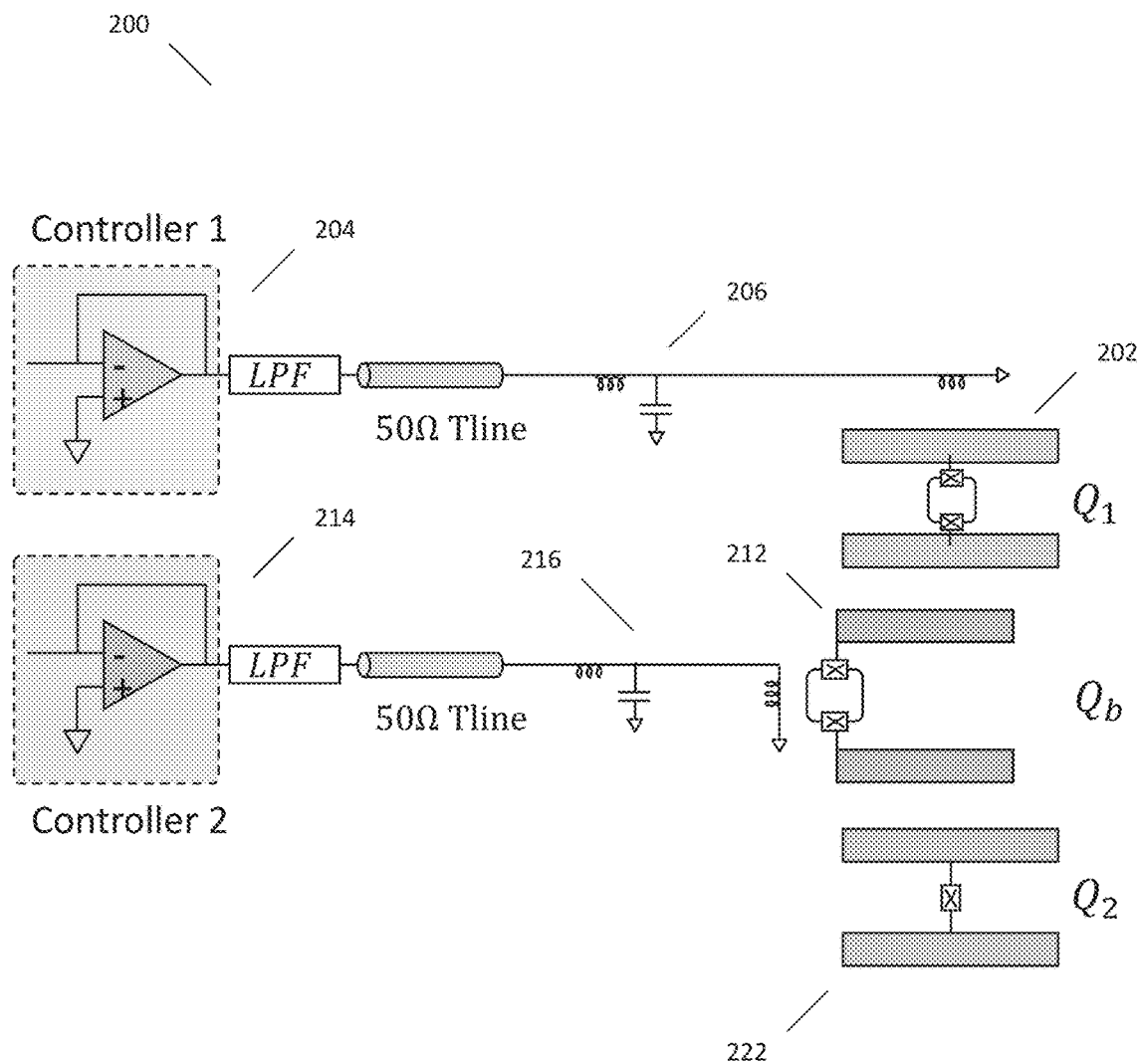
FIG. 2 illustrates an example non-limiting qubit device in accordance with one or more embodiments described herein.

Turning now to FIG. 2, an example non-limiting device 200 of one of the qubit devices 107A, 107B and/or 107C is illustrated.

As shown, device 200 can comprise qubit 202 ($Q_1$). In an embodiment, qubit 202 can be a flux tunable qubit. This means that rather than having a single set frequency, a frequency of qubit 202 can be modulated by applying a magnetic field to qubit 202. In an embodiment, this can be a broadband pulse in order to operate a broadband controlled-Z (CZ) gate. This can be achieved through controller 204 (Controller 1) which can send an electric current through wire 206 to produce a magnetic field in order to modulate the frequency of qubit 202. Qubit 202 can be coupled to flux tunable bus 212 ($Q_b$). Similarly to qubit 202, flux tunable bus 212 can have its frequency adjusted through the use of a magnetic field. This can be achieved through controller 214, which can send an electrical current through wire 216 to produce a magnetic field in order to modulate the frequency of flux tunable bus 212. In an embodiment, flux tunable bus 116 can additionally be coupled to a fixed frequency qubit 222 ($Q_2$), which is not adjustable through the use of magnetic fields. In an embodiment, flux tunable bus 212 can be utilized in order to mediate a state dependent rotation exchange between qubit 202 and qubit 222. For example, a magnetic flux applied to flux tunable bus 212 can determine an amount of entanglement (or an amount of Z exchange between qubits, wherein Z is a quantum state rotation) between qubit 202 and qubit 222. The degree or amount of entanglement can be calculated using the integral $\theta = \int_0^{t_g} 2\pi f_z(\Phi_0) dt$, wherein $\Phi_0$ is the changing magnetic flux in the flux tunable bus, $t_g$ is the gate length, and $f_z$ is the frequency of the pulse.

Under this example, flux tunable bus 212 controls when qubit 202 and qubit 222 are entangled, enabling entanglement to be mediated through whether flux tunable bus 212 is powered or not and/or the magnetic flux applied to flux tunable bus 212. In effect, this enables a state change of one of the qubits to impact the other. For example, qubit 202 can be utilized as an ancilla qubit with qubit 222 being used as a data qubit. In this example, qubit 202 can be used to read or write a quantum state to qubit 222 through the use of flux tunable bus 212 to mediate the quantum state rotation exchange between qubit 202 and qubit 222. In an embodiment, one or both of qubit 202 and qubit 222 can be transmons.

Figure 3:
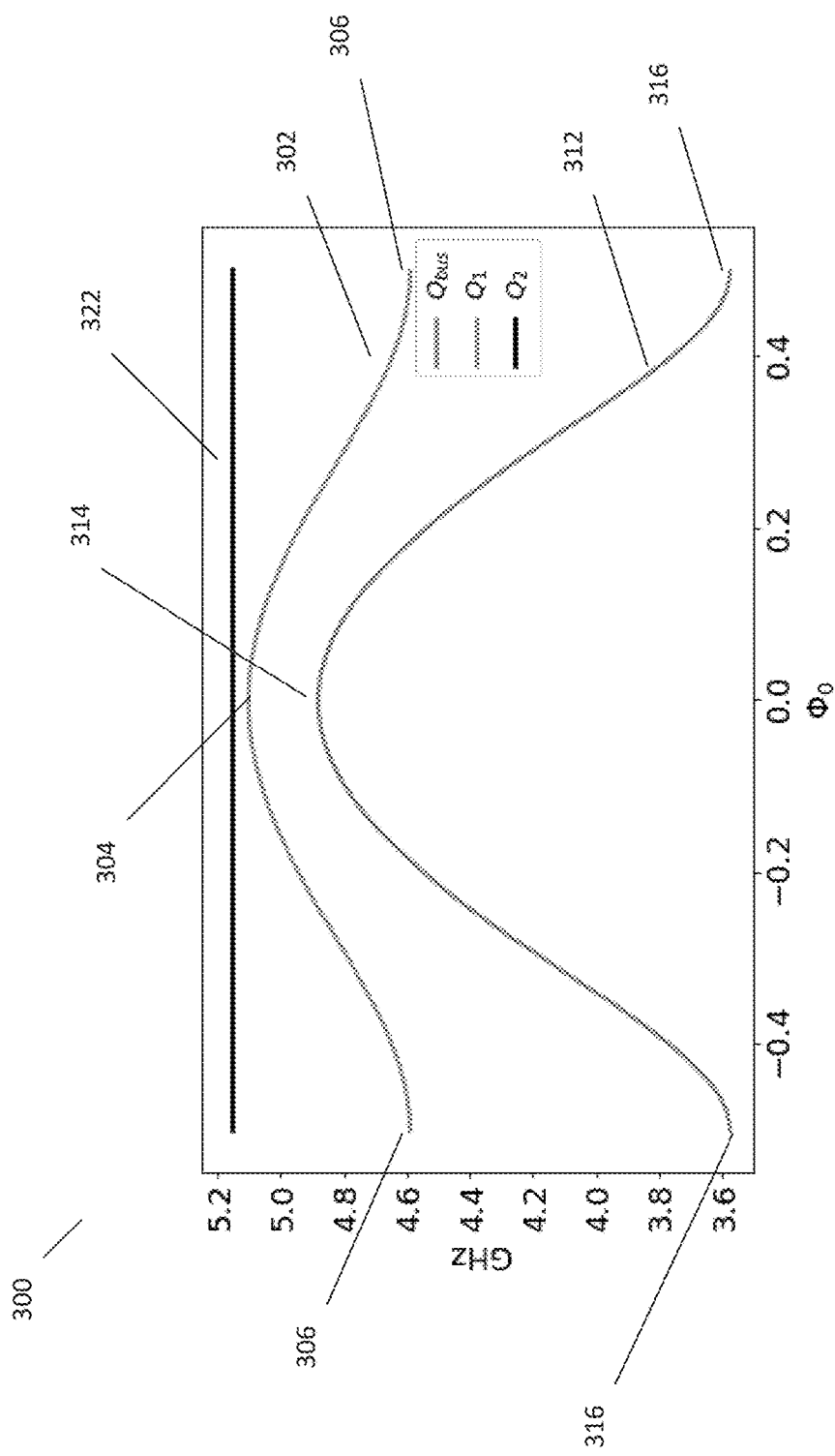
FIG. 3 illustrates a graph of frequency tunability of and a sweet spot in accordance with one or more embodiments described herein.

FIG. 3 illustrates a graph 300 of frequency tunability of, and a sweet spot in accordance with, one or more embodiments described herein.

As shown, graph 300 has a y-axis representing frequency, in gigahertz, and an x-axis representing the flux of a magnetic field in-order to show the change in frequency due to the change in flux. Graph 300 comprises line 302 representing qubit 202, line 312 representing flux tunable bus 212, and line 322 representing qubit 222. As qubit 222 is a fixed frequency qubit, line 322 is flat across graph 300, as a magnetic field will not change its frequency. Similarly, lines 302 and 312 vary in frequency due to changes in magnetic flux as qubit 202 and flux tunable bus 212 are flux tunable. Qubit 202 has two sweet spots, upper sweet spot 304 and lower sweet spot 306. At these points, qubit 202 is $1^{st}$ order insensitive to flux noise and graph 300 indicates that relatively large changes in magnetic flux (x-axis) will have a relatively small impact on frequency (y-axis) of line 302. Similarly, flux tunable bus 212 has two sweet spots, upper sweet spot 314 and lower sweet spot 316. In an embodiment, the frequency of qubit 222 can be higher than the frequency of qubit 202, and the frequency of qubit 202 can be higher than the frequency of flux tunable bus 212.

Quantum gate errors can be impacted by various parameters discussed above such as flux bias offset, flux pulse amplitude, flux pulse shape, flux pulse width, and single qubit gate parameters such as gate length and detuning. As such, a low error rate quantum gate can be calibrated based on these parameters in order to achieve low sensitivity to gate errors. In an embodiment, a frequency of the flux tunable qubit can be adjusted until a flux pulse applied to the flux tunable bus coincides with a bias region where the flux tunable bus is $1^{st}$ order insensitive to flux noise, wherein the flux pulse provides a high frequency of the flux tunable bus and the state dependent exchange provides an angle of rotation for a two qubit gate between the flux tunable qubit and the fixed frequency qubit. For example, the frequency of qubit 202 can be adjusted until the upper sweet spot of flux tunable bus 212 coincides with the fastest gate and lowest gate error of the quantum gate between qubit 202 and qubit 222. In an embodiment, the frequency of qubit 202 that creates this gate can be determined through the use of random benchmark parameters. These benchmark parameters can comprise flux bias offset, flux pulse amplitude, flux pulse shape, flux pulse width, buffer lengths, and/or single qubit gate parameters.

Figure 4A:
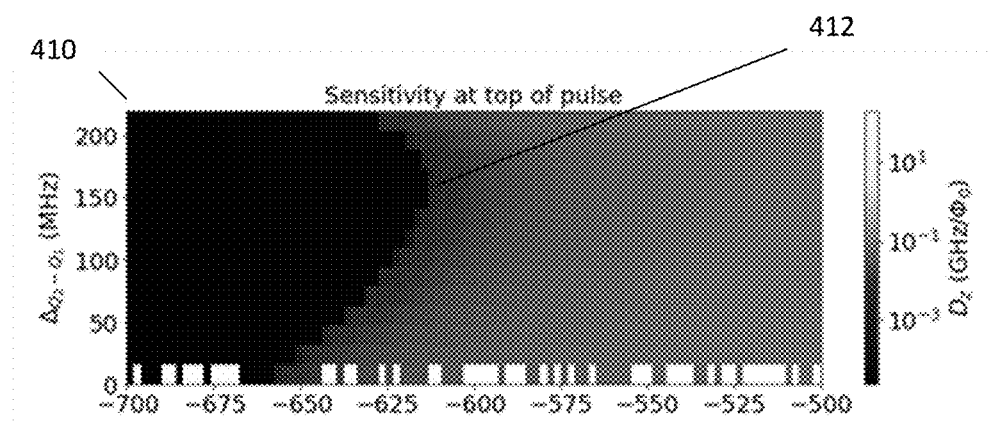
FIG. 4A illustrates a graph representing the change in flux sensitivity as a function of the detuning between the fixed frequency qubit and the flux tunable qubit, and the detuning between the flux tunable qubit and the flux tunable bus in accordance with one or more embodiments described herein.

FIG. 4A illustrates a graph 410 representing the change in flux sensitivity as a function of the detuning between qubit 222 and qubit 202, and the detuning between qubit 202 and the flux tunable bus 212 in accordance with one or more embodiments described herein.

The y-axis of graph 410 represents the detuning, or difference in frequency, between qubit 202 and qubit 222. The x-axis of graph 410 shows the detuning, or difference in frequency, between flux tunable bus 212 and qubit 202. The amount of gate errors is represented on a color scale where a brighter shade represents a high rate of gate errors and a darker shade represents a lower rate of gate errors. As such, parameters which provide low gate errors can be shown along curve 412 which shows the darkest shade, and thus the lowest rate of gate errors.

Figure 4B:
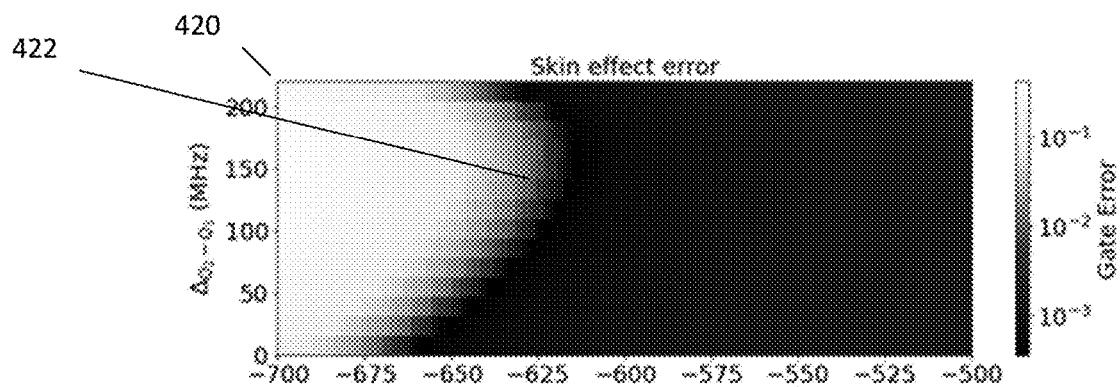
FIG. 4B illustrates a graph representing the change skin effect gate error as a function of the detuning between the fixed frequency qubit and the flux tunable qubit, and the detuning between the flux tunable qubit and the flux tunable bus in accordance with one or more embodiments described herein.

FIG. 4B illustrates a graph 420 representing the change skin effect gate error as a function of the detuning between qubit 222 and qubit 202, and the detuning between qubit 202 and flux tunable bus 212 in accordance with one or more embodiments described herein.

The y-axis of graph 420 represents the detuning, or difference in frequency, between qubit 202 and qubit 222. The x-axis of graph 420 show the detuning, or difference in frequency, between flux tunable bus 212 and qubit 202. The amount of gate errors is represented on a color scale where a brighter shade represents a high rate of gate errors and a darker shade represents a lower rate of gate errors. As such parameters which provide low gate errors can be shown along curve 422 which shows the darkest shade, and thus the lowest rate of gate errors.

Figure 4C:
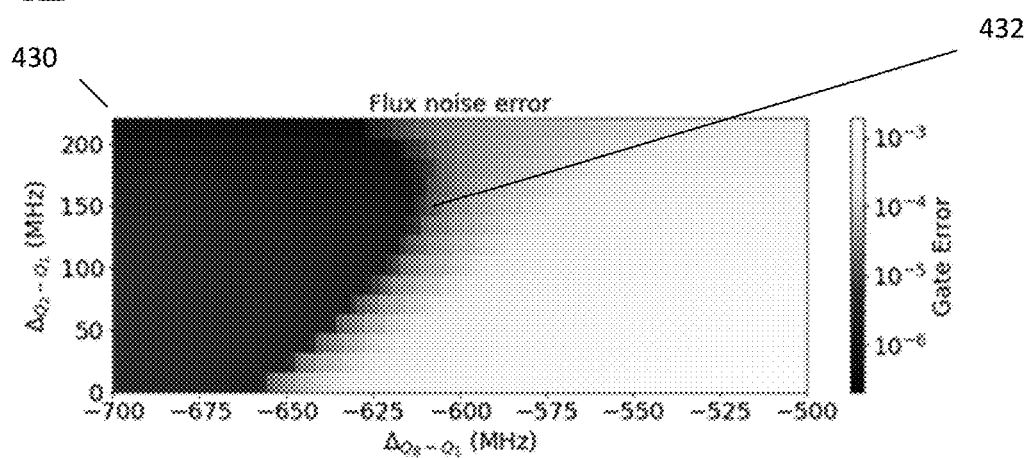
FIG. 4C illustrates a graph representing the change in flux noise gate error as a function of the detuning between the fixed frequency qubit and the flux tunable qubit, and the detuning between the flux tunable qubit and the flux tunable bus in accordance with one or more embodiments described herein.

FIG. 4C illustrates a graph 430 representing the change in flux noise gate error as a function of the detuning between qubit 222 and qubit 202, and the detuning between qubit 202 and flux tunable bus 212 in accordance with one or more embodiments described herein.

The y-axis of graph 430 represents the detuning, or difference in frequency, between qubit 202 and qubit 222. The x-axis of graph 430 show the detuning, or difference in frequency, between flux tunable bus 212 and qubit 202. The amount of gate errors is represented on a color scale where a brighter shade represents a high rate of gate errors and a darker shade represents a lower rate of errors. As such parameters which provide low gate errors can be shown along curve 432 which shows the darkest shade, and thus the lowest rate of gate errors.

Figure 5:
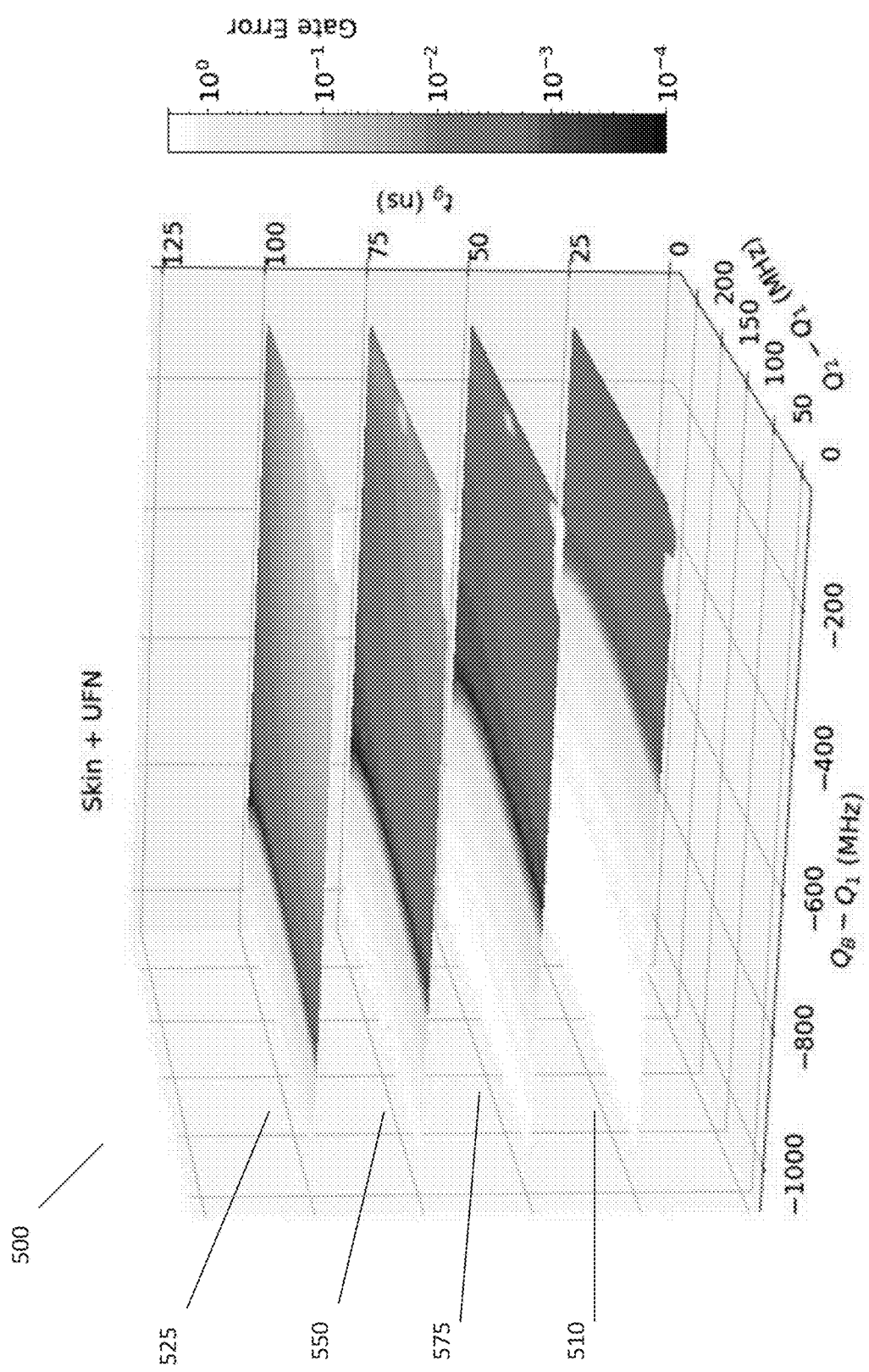
FIG. 5 illustrates a graph representing the change in gate error due to skin effect and flux noise based on the tunability of the qubit device and the variation of the gate length in accordance with one or more embodiments described herein.

FIG. 5 illustrates a graph 500 representing the change in gate error due to skin effect and flux noise based on the tunability of device 200 and the variation of the gate length in accordance with one or more embodiments described herein.

The y-axis of graph 500 represents the detuning, or difference in frequency, between flux tunable bus 212 and qubit 202. The x-axis of graph 500 represents the detuning, or difference in frequency, between qubit 202 and qubit 222. The z-axis represents the gate length of the gate between qubit 202 and qubit 222. The amount of gate errors is represented on a color scale where a brighter shade represents a high rate of gate errors and a darker shade represents a lower rate of gate errors. As shown, graph 500 shows four different gate lengths, 25 ns, 50 ns, 75 ns, and 100 ns. At each of the four gate lengths, there is a curve, 525, 550, 575, and 510 respectively, which represents a region of lowest gate errors indicated by the darkest shade.

Based on graphs 410, 420, 430 and 500, it should be appreciated that a low rate of gate error is impacted by several parameters and originates from several sources and types. As such, gate parameters and frequency of qubit 202 can be set to lower all types of gate errors taken as an average as opposed to lowering any one time of gate error. In another embodiment, if a single type of gate error is highly prevalent in a quantum system, a set of gate parameters and a frequency for qubit 202 can be determined to lower the single type of gate error specifically.

Figure 6:
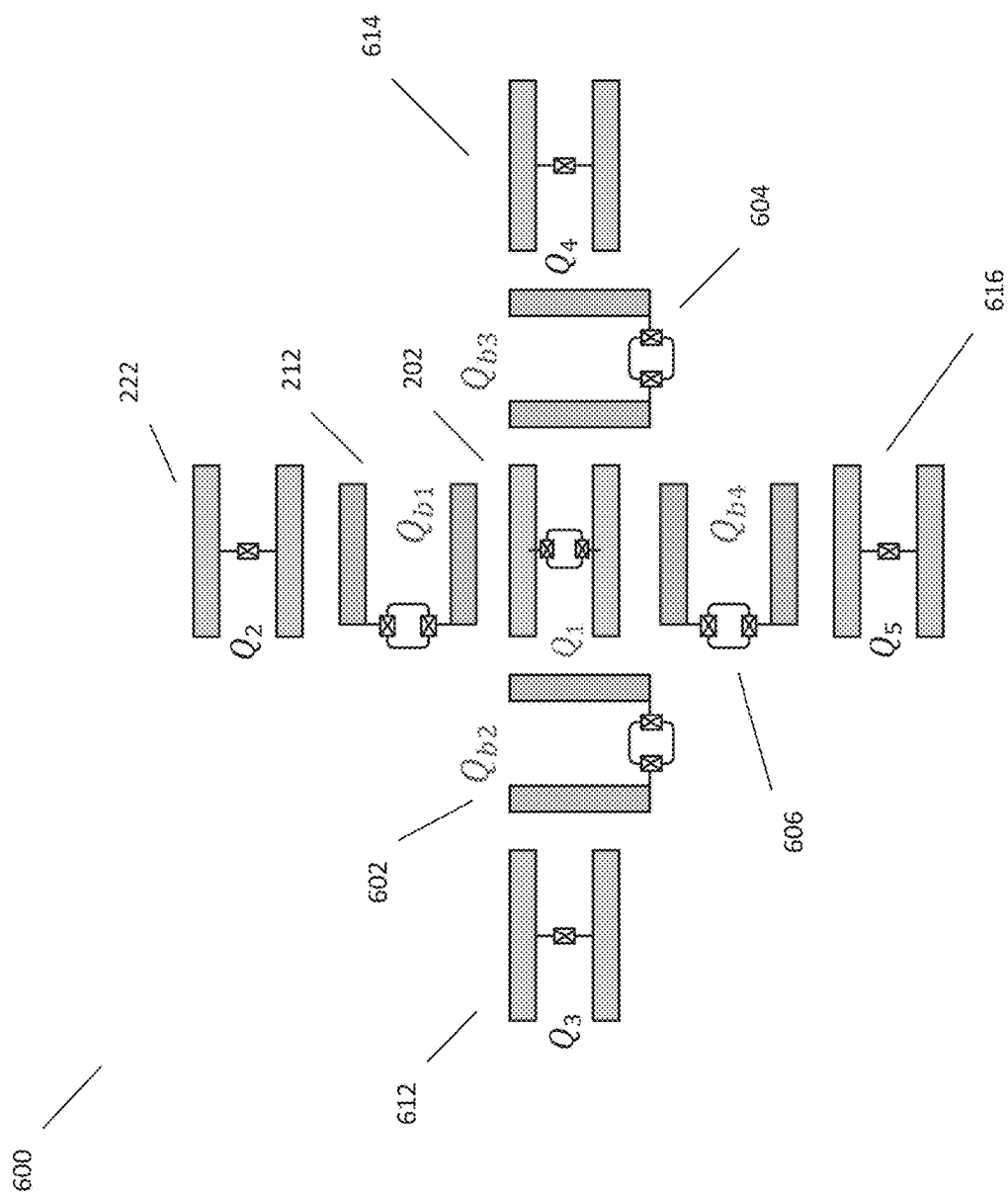
FIG. 6 illustrates a diagram of an example non-limiting device that can facilitate flux control for Pt order noise insensitivity in accordance with one or more embodiments described herein.

FIG. 6 illustrates a diagram of an example non-limiting device 600 that can facilitate flux control for $1^{st}$ order noise insensitivity in accordance with one or more embodiments described herein.

As entanglement between qubit 202 and qubit 222 is controlled by flux tunable bus 212 as described above, this allows for flexibility and scalability in qubit devices. For example, qubit 202 can be coupled to multiple additional flux tunable buses, such as flux tunable bus 602 ($Q_{b2}$), flux tunable bus 604 ($Q_{b3}$), and flux tunable bus 606 ($Q_{b4}$). These additional flux tunable buses can then be coupled to additional fixed frequency qubits such as qubit 612 ($Q_3$), qubit 614 ($Q_4$), and qubit 616 ($Q_5$) respectively. As qubit 202 will only be entangled to qubit 222, qubit 612, qubit 614, or qubit 616 based on which flux tunable bus is being operated, a scalable lattice structure is then created in which qubit 202 can act as an ancilla qubit between data qubits qubit 222, qubit 612, qubit 614, and qubit 616 based on which flux tunable bus is being operated at the time. Additionally, a low error rate gate can be created between qubit 202 and each of the data qubits, similarly to how a low error rate gate was initialized between qubit 202 and qubit 222 as described above. For example, a low error rate gate can be initialized between qubit 202 and qubit 612 by adjusting a frequency of qubit 202 until a flux pulse applied to flux tunable bus 602 coincides with a bias region where flux tunable bus 602 is $1^{st}$ order in-sensitive to flux noise, wherein the flux pulse provides a high frequency of the flux tunable bus 212 and the state dependent exchange provides an angle of rotation for the two qubit gate between qubit 202 and qubit 612. This process can then be repeated for flux tunable bus 604 and flux tunable bus 606. It should be noted that qubit 202 can have a different frequency for each of flux tunable bus 212, flux tunable bus 602, flux tunable bus 604, and flux tunable bus 606.

It should be appreciated that by coupling a flux tunable qubit to a flux tunable bus, a scalable qubit lattice structure can be created wherein the flux tunable qubit is coupled to one or more fixed frequency qubits via one or more flux tunable busses. This enables the creation of quantum gates between the flux tunable qubit and the fixed frequency qubit based on which flux tunable bus is operated at any given time. This structure enables large scalability as more flux tunable buses can be added, while also enabling tunability to enable gates with low gate errors and resistance to flux noise.

Figure 7:
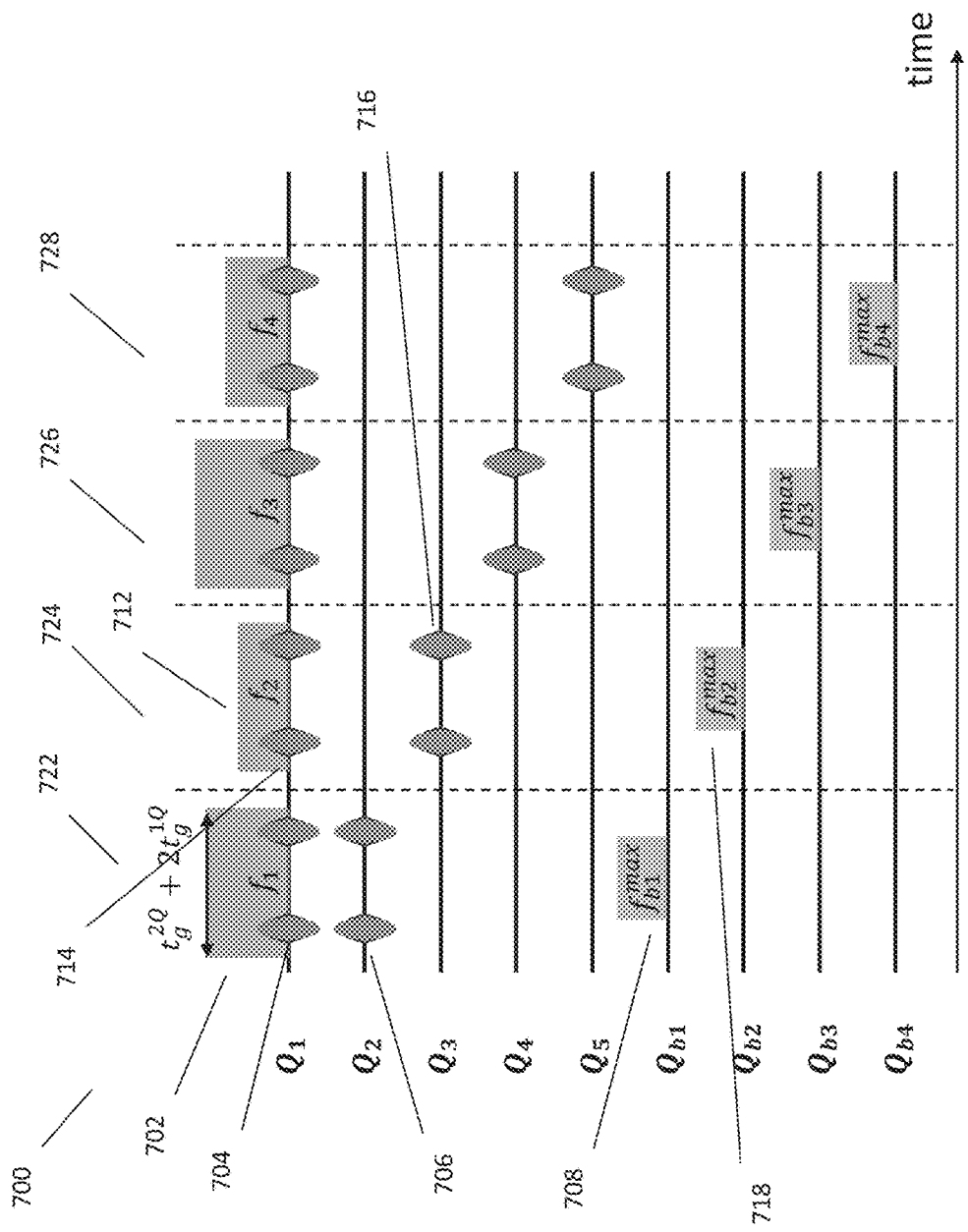
FIG. 7 illustrates a timing diagram showing a sequence of pulses for targeting device operation of flux pulses in regions of low flux sensitivity in accordance with one or more embodiments described herein.

FIG. 7 illustrates a timing diagram 700 showing a sequence of pulses for targeting device operation of flux pulses in regions of low flux sensitivity in accordance with one or more embodiments described herein.

Diagram 700 comprises rows for all qubits and flux tunable buses in device 600 and columns 722, 724, 726, and 728 for low error rate gates between qubit 202 and qubits 222, 612, 614, and 616 respectively. At 702, a first frequency of qubit 202, $f_1$, can be determined in order to create a low error rate gate between qubit 202 and qubit 222 as described in detail above. At 704, a quantum state can be applied to qubit 202 and at 706 a quantum state can be applied to qubit 222. At 708, flux tunable bus 212 can be operated at a high frequency, $f_{b1}^{max}$, in order to operate the quantum gate between qubit 202 and qubit 222. Similarly, at 712, a second frequency of qubit 202, $f_2$, can be determined in order to create a low error rate gate between qubit 202 and qubit 612. At 714, a quantum state can be applied to qubit 202 and at 716 a quantum state can be applied to qubit 612. At 718, flux tunable bus 602 can be operated at a high frequency, $f_{b2}^{max}$, in order to operate the quantum gate between qubit 202 and qubit 612. This can be repeated in column 724 and 726 in order to target low error rate gates between qubit 202 and qubits 614 and 616 respectively. Additionally, it should be appreciated that device 600 can be scaled to have any number of flux tunable buses and any number of fixed frequency qubits. For example, device 600 can be scaled to have ten flux tunable buses and ten fixed frequency qubits.

Figure 8:
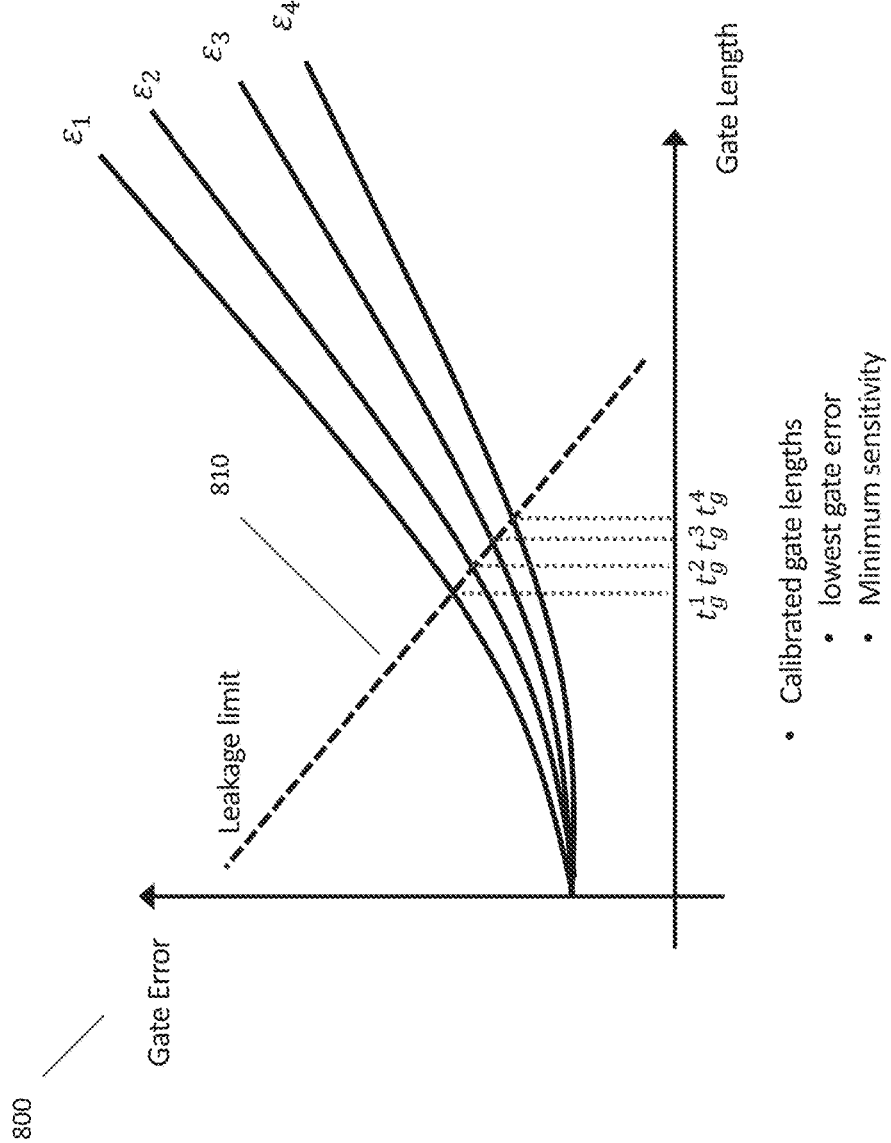
FIG. 8 illustrates a graph that shows variation in gate lengths due to device disorder and the correlation between gate length and randomized benchmarking in accordance with one or more embodiments described herein.

FIG. 8 illustrates a graph 800 that shows variation in low error rate gate lengths due to device disorder and the correlation between gate length and randomized benchmarking in accordance with one or more embodiments described herein.

The y-axis of graph 800 shows the rate of gate errors and the x-axis shows the gate length in time. Randomized benchmarking parameter sets $\varepsilon_1$, $\varepsilon_2$, $\varepsilon_3$, and $\varepsilon_4$ are plotted in respect to different gate lengths used in combination with the parameter sets. A leakage limit 810 is shown where gate lengths past the leakage limit 810 greatly increases gate error due to loss of gate coherence due to gate length. As shown by points $t_g^1$, $t_g^2$, $t_g^3$, and $t_g^4$, there exists a range of gate lengths for each parameter set, just prior to leakage limit 810, in order to achieve a gate which is fast with a low amount of gate errors.

Figure 9:
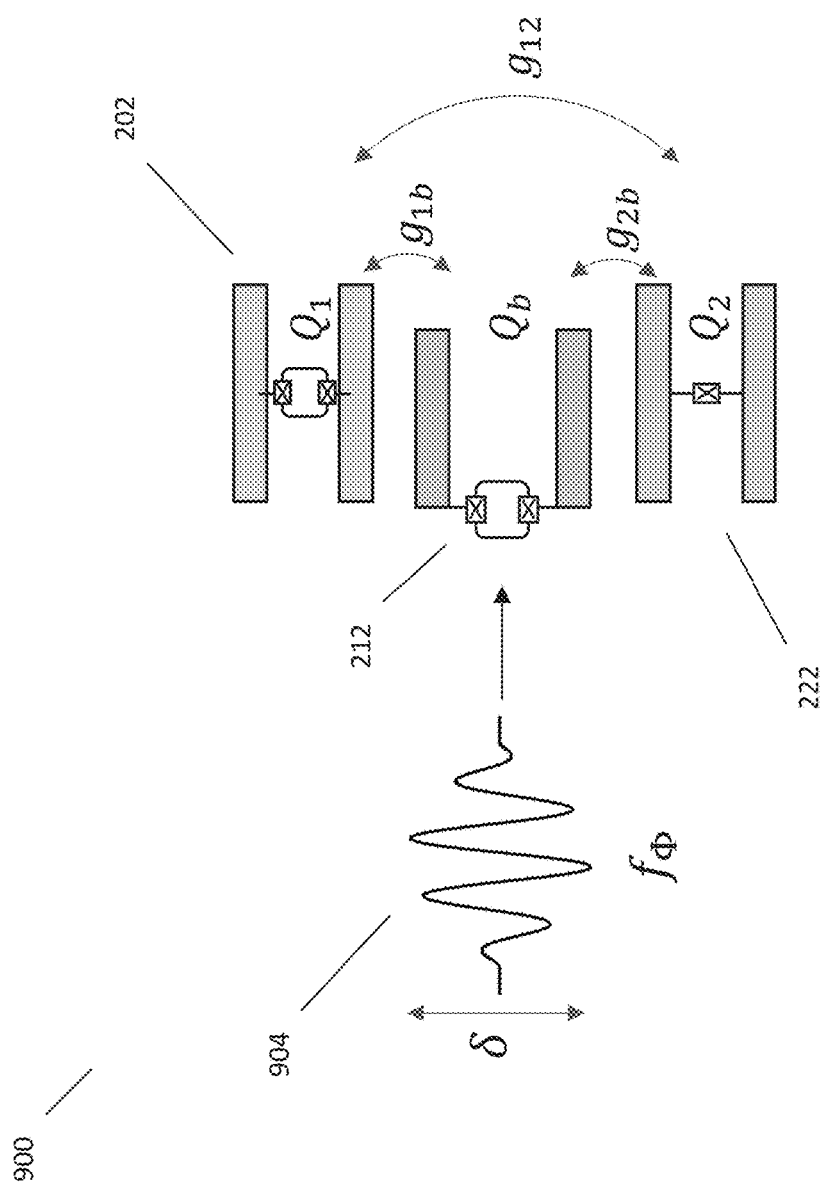
FIG. 9 illustrates a diagram of an example non-limiting device that can facilitate operation of parametric gates in accordance with one or more embodiments described herein.

FIG. 9 illustrates a diagram of an example non-limiting device 900 that can facilitate operation of parametric gates. As opposed to the gates described in detail above in which a broadband pulse can be applied to a flux tunable bus, a parametric gate can be operated by applying a radio frequency (RF) pulse to a flux tunable bus.

Device 900 can comprise qubit 202 ($Q_1$), flux tunable bus 212 ($Q_b$), and qubit 222 ($Q_2$) of device 200. 904 is a RF pulse which modulates flux tunable bus 212. It should be appreciated that device 200 and device 900 can be used interchangeably, simply with a difference of whether a broadband pulse or a RF pulse is applied to flux tunable bus 212. $G_{1b}$ represents a coupling between qubit 202 and flux tunable bus 212. $G_{2b}$ represents a coupling between qubit 222 and flux tunable bus 212. $G_{12}$ represents a coupling between qubit 202 and qubit 222 due to the couplings $G_{1b}$ and $G_{2b}$. In a parametric gate, a resonant frequency exchange between qubit 202 and qubit 222 can occur when modulating flux tunable bus 212 with a RF pulse at a frequency equal to the detuning of qubit 202 and qubit 222. Depending on the detuning, different forms of parametric gates can be operated such as an iSWAP gate (a gate which swaps the state of two qubits) and a parametric CZ gate.

In an embodiment, given a device comprising a flux tunable qubit capacitively coupled to a flux tunable bus, wherein the flux tunable bus is capacitively coupled to a fixed frequency qubit, a low error rate iSWAP gate can be operated by biasing the flux tunable qubit at a frequency where the flux tunable qubit is $1^{st}$ order insensitive to flux noise, the flux tunable bus is biased at a point where there is a low amount of state dependent exchange rotation between the flux tunable qubit and the fixed frequency qubit, and the flux tunable bus is modulated at a frequency equal to the energy difference between qubit states $|10\rangle - |01\rangle$ of the flux tunable qubit and the fixed frequency qubit. For example, qubit 202 can be biased at either its upper or lower sweet spot, as that frequency will make qubit 202 1st order insensitive to flux noise as described above. Flux tunable bus 212 can be biased at a point where the amount of state dependent exchange rotation between qubit 202 and qubit 222 is low. Flux tunable bus 212 can then be modulated by an RF pulse at a frequency equal to the detuning between qubit 202 in the state $|10\rangle$ and qubit 222 in the state $|01\rangle$. The bias point of flux tunable bus 212 can be determined through the use of random benchmarking of different parameter sets and gate lengths as described above, as well as whether qubit 202 is at the upper or lower sweet spot.

In another embodiment, a parametric CZ can be operated by modulating the flux tunable bus at a frequency equal to the energy difference between qubit states $|11\rangle - |02\rangle$ or $|11\rangle - |20\rangle$ of the flux tunable qubit and the fixed frequency qubit. For example, a low error rate parametric CZ can be operated in the same manner as the iSWAP gate described above, however, flux tunable bus 212 can be modulated by an RF pulse equal to the detuning between qubit 202 in the state $|11\rangle$ and qubit 222 in either the state $|02\rangle$ or $|20\rangle$. It should be appreciated that this process can be repeated for multiple flux tunable buses and multiple fixed frequency qubits. For example, given device 600 which comprises multiple flux tunable buses and multiple fixed frequency qubits, this process can be performed to create multiple parametric gates within device 600.

In order to operate a parametric gate effectively, there should be a low amount of ZZ with some amount of J, wherein J is the measure of the strength of coupling between two transmons. Otherwise, the parametric gate can suffer from leakage, limited gate fidelity, and higher gate errors. J can be computed as $J_{12} = g_{1b}g_{2b}/2(1/f_1 - f_b(\Phi) + 1/f_2 - f_b(\Phi)) + g_{12}$, wherein $J_{12}$ is the strength of the coupling between qubit 202 and qubit 222.

Figure 10:
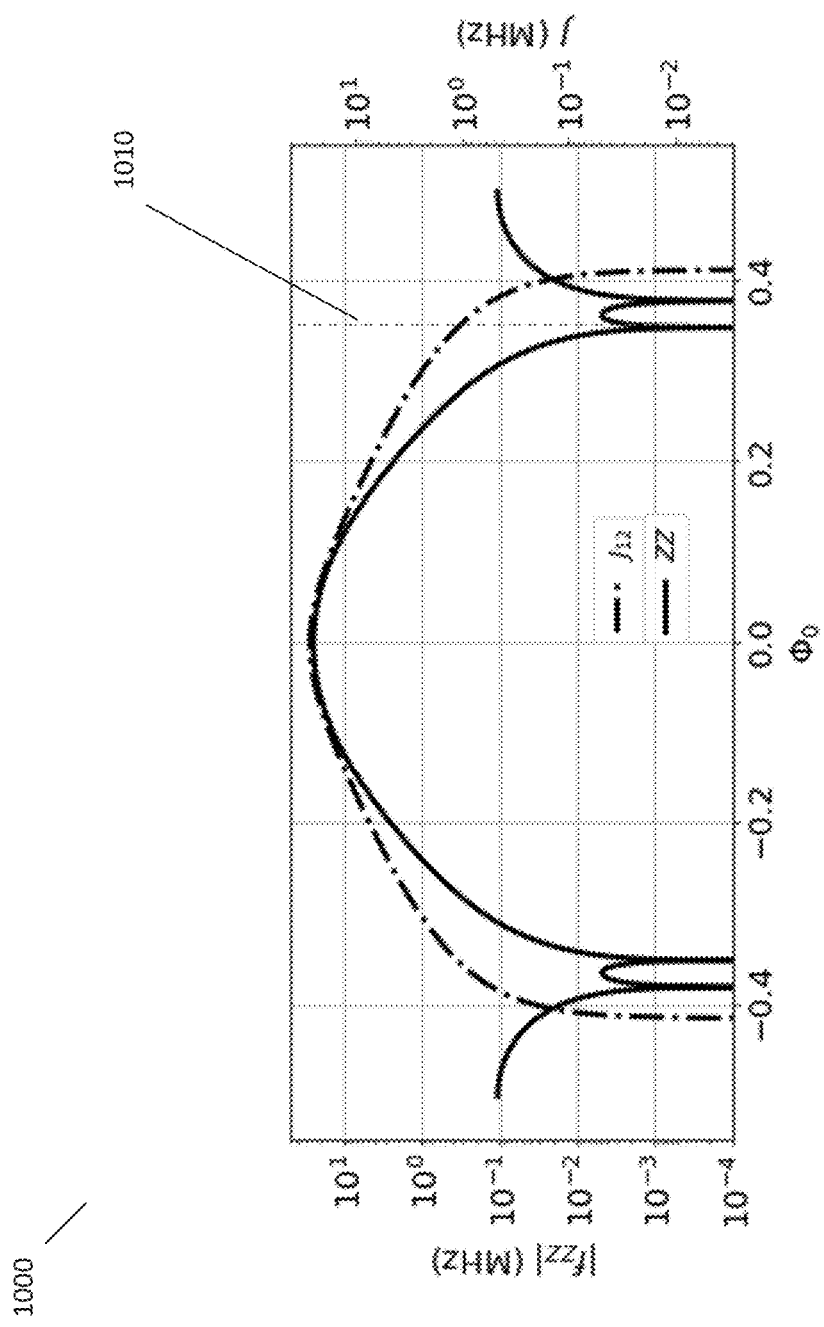
FIG. 10 illustrates a graph that show the correlation between ZZ and J in accordance with embodiments described therein.

FIG. 10 illustrates a graph 1000 that show the correlation between ZZ and J in accordance with embodiments described therein.

The y-axis of graph 1000 show ZZ and J, while the x-axis shows magnetic flux. As shown by line 1010, there exists a point at which the amount of ZZ is low, but there still exists $J_{12}$, a coupling between qubit 202 and qubit 222. In order to bias flux tunable bus 212, the flux pulse which corresponds to line 1010 can be applied to flux tunable bus 212.

Figure 11:
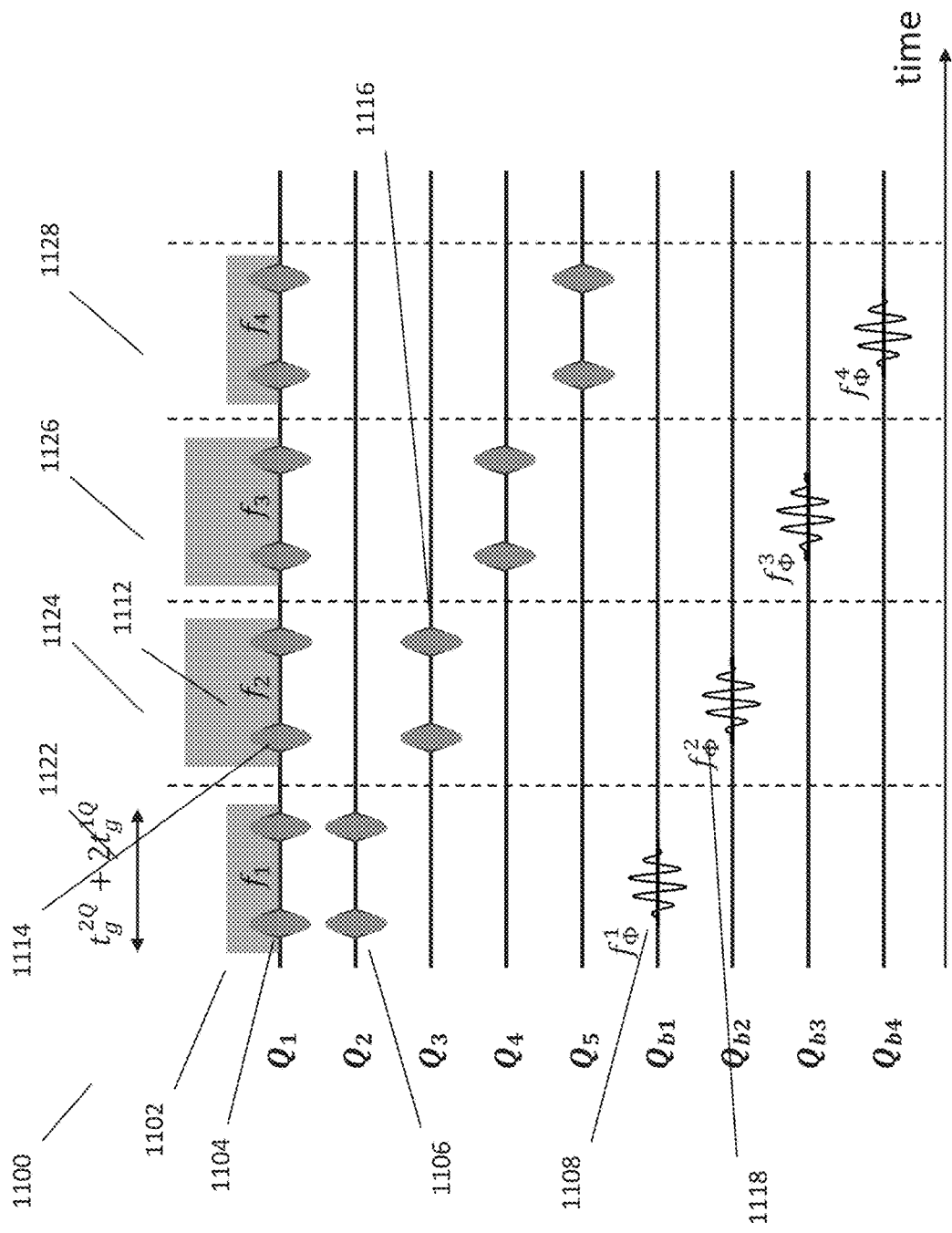
FIG. 11 illustrates a timing diagram showing a sequence of pulses for targeting device operation of parametric gates in regions of low flux sensitivity in accordance with one or more embodiments described herein.

FIG. 11 illustrates a timing diagram 1100 showing a sequence of pulses for targeting device operation of parametric gates in regions of low flux sensitivity in accordance with one or more embodiments described herein.

Diagram 1100 comprises rows for all qubits and flux tunable buses in device 600 and columns 1122, 1124, 1126, and 1128 for parametric gates between qubit 202 and qubits 222, 612, 614, and 616 respectively. At 1102, the frequency of qubit 202 can be biased at either qubit's 202 upper or lower sweet spot. The choice of upper or lower sweet spot can be based on lowering the rate of gate errors and collisions. At 1104, a quantum state can be applied to qubit 202 and at 1106 a quantum state can be applied to qubit 222. At 1108, an RF pulse at the frequency equal to the energy of the detuning between qubit 202 and qubit 222 can be applied to flux tunable bus 212. Similarly, at 1112, qubit 202 can be biased at either qubit's 202 upper or lower sweet spot. At 1114, a quantum state can be applied to qubit 202 and at 1116 a quantum state can be applied to qubit 612. At 1118 an RF pulse at the frequency equal to the energy of the detuning between qubit 202 and qubit 612 can be applied to flux tunable bus 602. This can be repeated in column 1124 and 1126 in order to operate low error rate parametric gates between qubit 202 and qubits 614 and 616 respectfully. It should be appreciated that while qubit 202 will be at either its upper or lower sweet spot in each of column 1122, 1124, 1126, and 1128, the RF pules applied to flux tunable buses 602, 604, and 606 can be different as the detunings between qubit 202 and qubits 222, 612, 614, and 616 will be different based on the qubits' different frequencies. Additionally, flux tunable buses 212, 602, 604, and 606 can be biased at different points as the bias regions that provide a low amount of ZZ and some measure of J will be different for each flux tunable bus and each gate.

In another embodiment, given a device comprising a flux tunable qubit capacitively coupled to a flux tunable bus, wherein the flux tunable bus is capacitively coupled to a fixed frequency qubit, a low error rate cross resonance gate can be operated by biasing the flux tunable qubit at a frequency where the flux tunable qubit is $1^{st}$ order insensitive to flux noise, biasing the flux tunable bus at a frequency where the amount of state dependent exchange rotation between the flux tunable qubit and the fixed frequency qubit is low, and driving the flux tunable qubit at the frequency of the fixed frequency qubit. For example, qubit 202 can be biased at either its upper or lower sweet spot. Flux tunable bus 212 can be biased in the same manner as for a parametric gate as described in detail above. Qubit 202 can then be driven at the frequency of qubit 222 for a certain gate length and a certain amplitude to create low sensitivity and gate errors using random benchmarking as described in detail above.

It should be appreciated, devices 200, 600, and 900 as described herein can be used to operate low error rate quantum gates such as broadband CZ gates, parametric gates, and cross resonance gates, all of which can be tuned in order to provide low sensitivity and a low rate of gate errors, while also being scalable to enable the coupling of additional flux tunable buses and fixed frequency qubits, thus enabling the operation of more gates.

Figure 12:
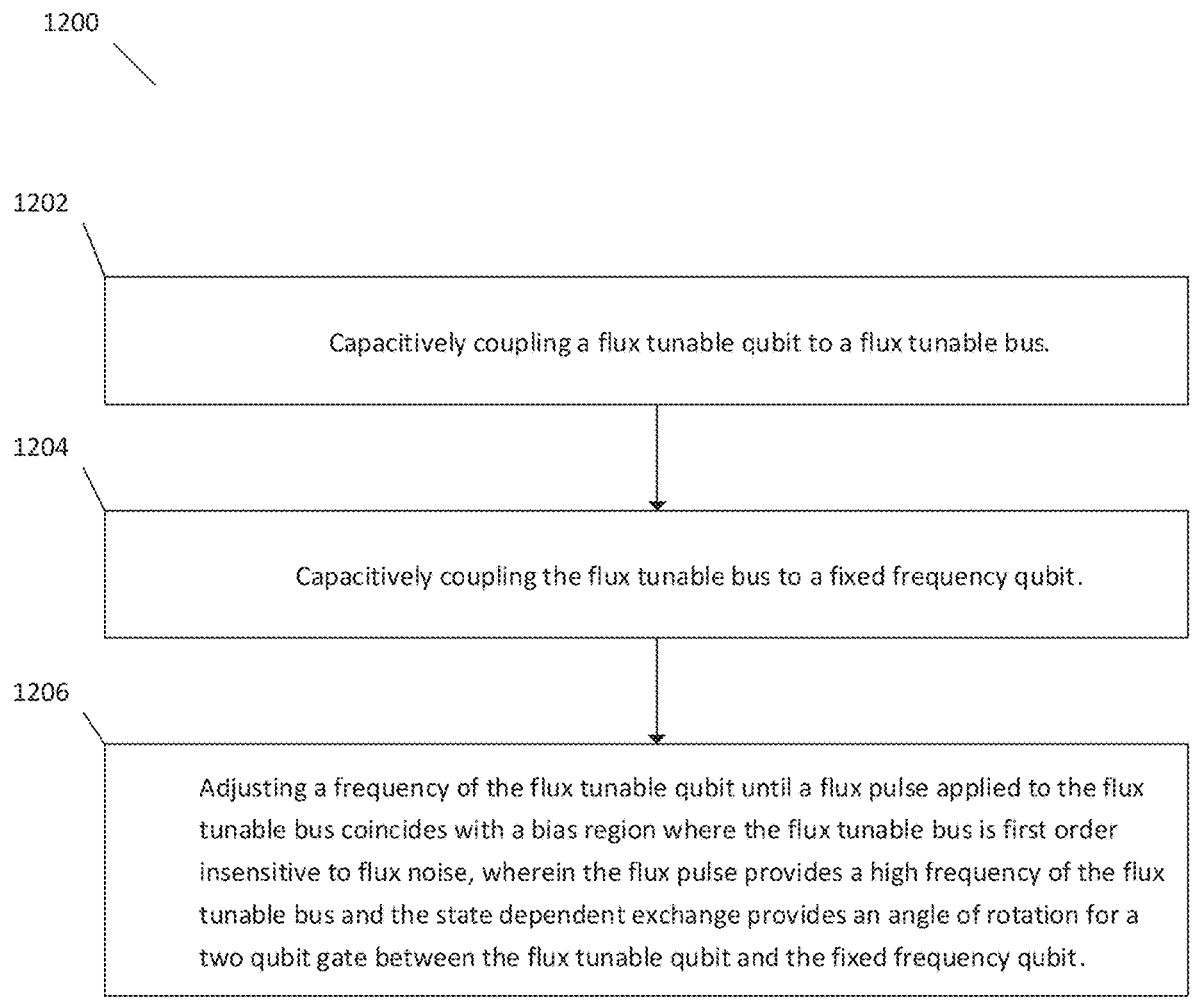
FIG. 12 illustrates a flow diagram of an example, non-limiting method that can facilitate operation of a CZ broadband gate with $1^{st}$ order insensitivity to flux noise in accordance with one or more embodiments described herein.

FIG. 12 illustrates a flow diagram of an example, non-limiting method 1200 that can facilitate operation of a CZ broadband gate with Pt order insensitivity to flux noise in accordance with one or more embodiments described herein. Repetitive description of like elements and/or processes employed in respective embodiments is omitted for sake of brevity.

At 1202, method 1200 can comprise capacitively coupling a flux tunable qubit (e.g., qubit 202) to a flux tunable bus (e.g., flux tunable bus 212).

At 1204, method 1200 can comprise capacitively coupling the flux tunable bus (e.g., flux tunable bus 212) to a fixed frequency qubit (e.g., qubit 222). For example, as described above in reference to FIG. 1, the flux tunable bus can mediate a state dependent exchange rotation between the flux tunable qubit and the fixed frequency qubit. This enables the fixed frequency qubit to act as a data qubit and the flux tunable qubit to act as an ancilla qubit. Additionally, as described above in reference to FIG. 5, multiple flux tunable buses which are coupled to multiple fixed frequency qubits can be coupled to the flux tunable qubit to create multiple gate lattice structures.

At 1206, method 1200 can comprise adjusting a frequency (e.g., via controller 204) of the flux tunable qubit (e.g., qubit 202) until a flux pulse applied (e.g., via controller 214) to the flux tunable bus (e.g., flux tunable bus 212) coincides with a bias region where the flux tunable bus is $1^{st}$ order insensitive to flux noise, wherein the flux pulse provides a high frequency of the flux tunable bus and the state dependent exchange provides an angle of rotation for a two qubit gate between the flux tunable qubit and the fixed frequency qubit. As described above in reference to FIGS. 1-4, device sensitivity and gate errors are impacted by multiple parameters, and random benchmarking tests or parameter sets can be used to determine a parameter set, including a frequency of the flux tunable qubit, in order to operate a device which is $1^{st}$ order insensitive to flux noise.

Figure 13:
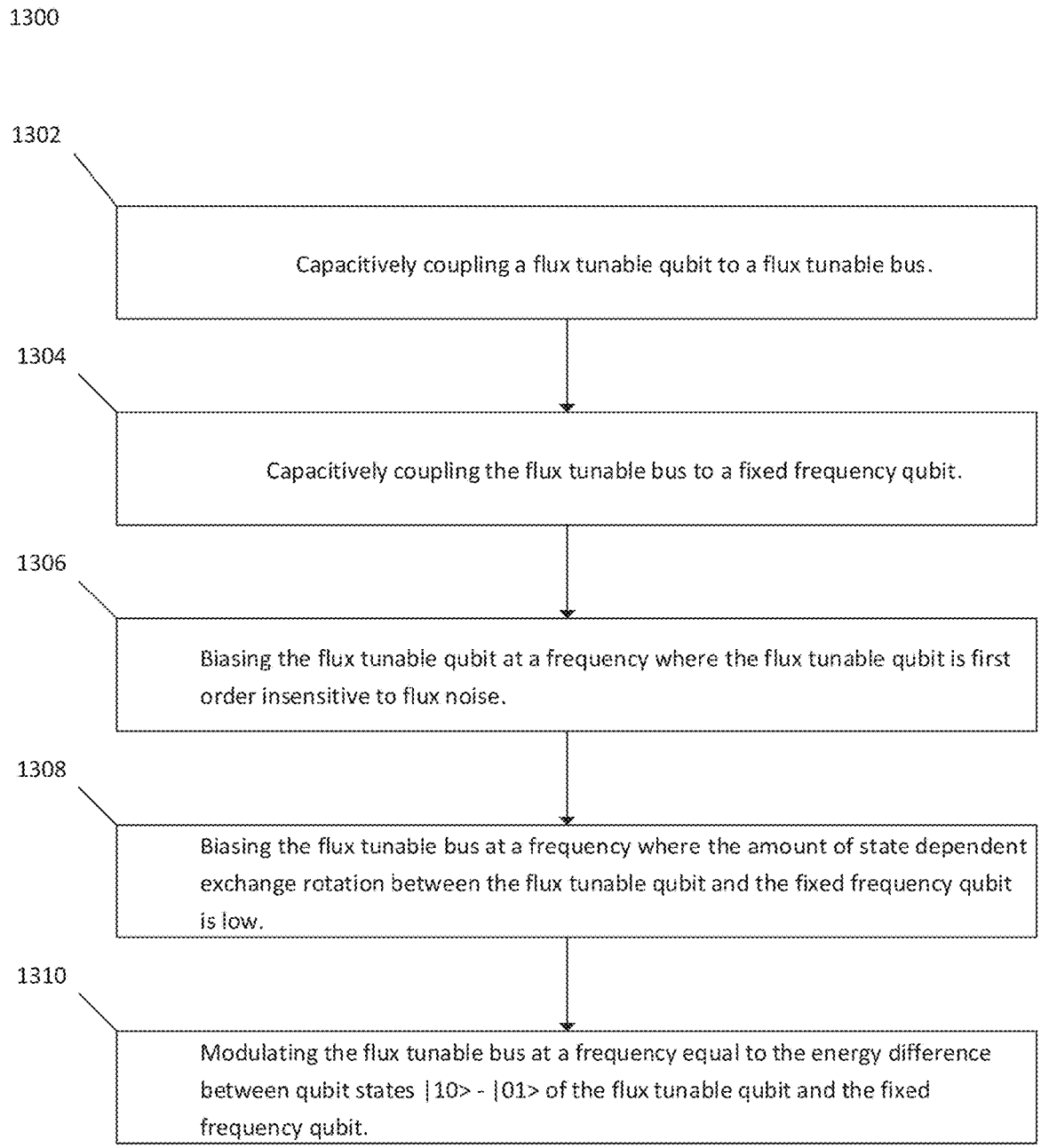
FIG. 13 illustrates a flow diagram of an example, non-limiting method 1300 that can facilitate operation of an iSWAP parametric gate with $1^{st}$ order insensitivity to flux noise in accordance with one or more embodiments described herein.

FIG. 13 illustrates a flow diagram of an example, non-limiting method 1300 that can facilitate operation of an iSWAP parametric gate with Pt order insensitivity to flux noise in accordance with one or more embodiments described herein. Repetitive description of like elements and/or processes employed in respective embodiments is omitted for sake of brevity.

At 1302, method 1300 can comprise capacitively coupling a flux tunable qubit (e.g., qubit 202) to a flux tunable bus (e.g., flux tunable bus 212).

At 1304, method 1300 can comprise capacitively coupling the flux tunable bus (e.g., flux tunable bus 212) to a fixed frequency qubit (e.g., qubit 222). For example, as described above in reference to FIG. 1, the flux tunable bus can mediate a state dependent exchange rotation between the flux tunable qubit and the fixed frequency qubit. This enables the fixed frequency qubit to act as a data qubit and the flux tunable qubit to act as an ancilla qubit. Additionally, as described above in reference to FIG. 5, multiple flux tunable buses which are coupled to multiple fixed frequency qubits can be coupled to the flux tunable qubit to create multiple gate lattice structures.

At 1306, method 1300 can comprise, biasing (e.g., via controller 204) the flux tunable qubit (e.g., qubit 202) at a frequency where the flux tunable qubit is $1^{st}$ order insensitive to flux noise. For example, as described above in detail in reference to FIGS. 1-2 and 10, the flux tunable qubit has an upper and lower sweet spot where the flux tunable qubit is $1^{st}$ order insensitive to flux noise. The flux tunable qubit can be biased at either the upper sweet spot or the lower sweet spot, based on which one provides fewer gate errors and collisions.

At 1308, method 1300 can comprise, biasing (e.g., via controller 214) the flux tunable bus (e.g., flux tunable bus 212) at a frequency where the amount of state dependent exchange rotation between the flux tunable quit (e.g., qubit 202) and the fixed frequency qubit (e.g., qubit 222) is low. For example, as describe above in reference to FIGS. 8-10, the flux tunable bus can be biased at a frequency where the amount of ZZ between the flux tunable qubit and the fixed frequency qubit is low, but there is still some amount of coupling between the flux tunable qubit and the fixed frequency qubit, measured as J. By lowering the amount of ZZ between the flux tunable qubit the fixed frequency qubit, sensitivity can be decreased, and gate errors reduced. In an embodiment, the bias point for the flux tunable bus can be determined through the use of random benchmarking.

At 1310, method 1300 can comprise, modulating (e.g., via controller 214) the flux tunable bus (e.g., flux tunable bus 212) at a frequency equal to the energy difference between qubit states $|10\rangle - |01\rangle$ of the flux tunable qubit (e.g., qubit 202) and the fixed frequency qubit (e.g., qubit 222). For example, as described above in reference to FIG. 8, the flux tunable bus can be modulated by an RF pulse at a frequency equal to the detuning between the flux tunable qubit in the state $|10\rangle$ and the fixed frequency qubit in the state $|01\rangle$.

Figure 14:
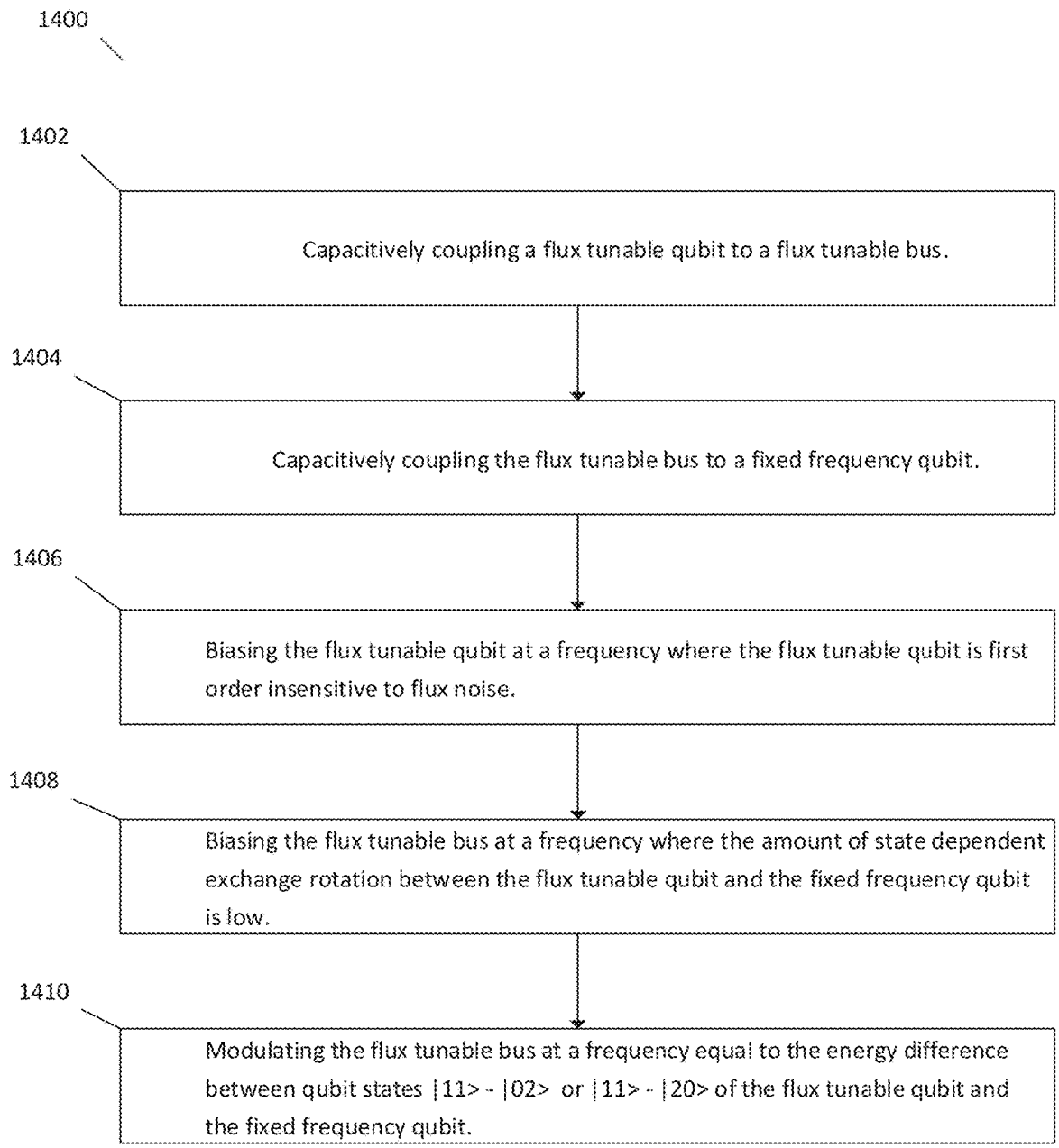
FIG. 14 illustrates a flow diagram of an example, non-limiting method 1400 that can facilitate operation of a CZ parametric gate with $1^{st}$ order insensitivity to flux noise in accordance with one or more embodiments described herein.

FIG. 14 illustrates a flow diagram of an example, non-limiting method 1400 that can facilitate operation of a CZ parametric gate with Pt order insensitivity to flux noise in accordance with one or more embodiments described herein. Repetitive description of like elements and/or processes employed in respective embodiments is omitted for sake of brevity.

At 1402, method 1400 can comprise capacitively coupling a flux tunable qubit (e.g., qubit 202) to a flux tunable bus (e.g., flux tunable bus 212).

At 1404, method 1400 can comprise capacitively coupling the flux tunable bus (e.g., flux tunable bus 212) to a fixed frequency qubit (e.g., qubit 222). For example, as described above in reference to FIG. 1, the flux tunable bus can mediate a state dependent exchange rotation between the flux tunable qubit and the fixed frequency qubit. This enables the fixed frequency qubit to act as a data qubit and the flux tunable qubit to act as an ancilla qubit. Additionally, as described above in reference to FIG. 5, multiple flux tunable buses which are coupled to multiple fixed frequency qubits can be coupled to the flux tunable qubit to create multiple gate lattice structures.

At 1406, method 1400 can comprise, biasing (e.g., via controller 204) the flux tunable qubit (e.g., qubit 202) at a frequency where the flux tunable qubit (e.g., qubit 202) is $1^{st}$ order insensitive to flux noise. For example, as described above in detail in reference to FIGS. 1-2 and 10, the flux tunable qubit has an upper and lower sweet spot where the flux tunable qubit is $1^{st}$ order insensitive to flux noise. The flux tunable qubit can be biased at either the upper sweet spot or the lower sweet spot, based on which one provides fewer gate errors and collisions.

At 1408, method 1400 can comprise, biasing (e.g., via controller 214) the flux tunable bus (e.g., flux tunable bus 212) at a frequency where the amount of state dependent exchange rotation between the flux tunable quit (e.g., qubit 202) and the fixed frequency qubit (e.g., qubit 222) is low. For example, as describe above in reference to FIGS. 8-10, the flux tunable bus can be biased at a frequency where the amount of ZZ between the flux tunable qubit and the fixed frequency qubit is low, but there is still some amount of coupling between the flus tunable qubit and the fixed frequency qubit, measured as J. By lowering the amount of ZZ between the flux tunable qubit the fixed frequency qubit, sensitivity can be decreased, and gate errors reduced. In an embodiment, the bias point for the flux tunable bus can be determined through the use of random benchmarking.

At 1410, method 1400 can comprise, modulating (e.g., via controller 214) the flux tunable bus (e.g., flux tunable bus 212) at a frequency equal to the energy difference between qubit states $|11\rangle - |02\rangle$ or $|11\rangle - |20\rangle$ of the flux tunable qubit (e.g., qubit 202) and the fixed frequency qubit (e.g., qubit 222). For example, as described above in reference to FIG. 8, the flux tunable bus can be modulated by an RF pulse at a frequency equal to the detuning between the flux tunable qubit in the state $|11\rangle$ and the fixed frequency qubit in the state $|02\rangle$ or the state $|20\rangle$.

Figure 15:
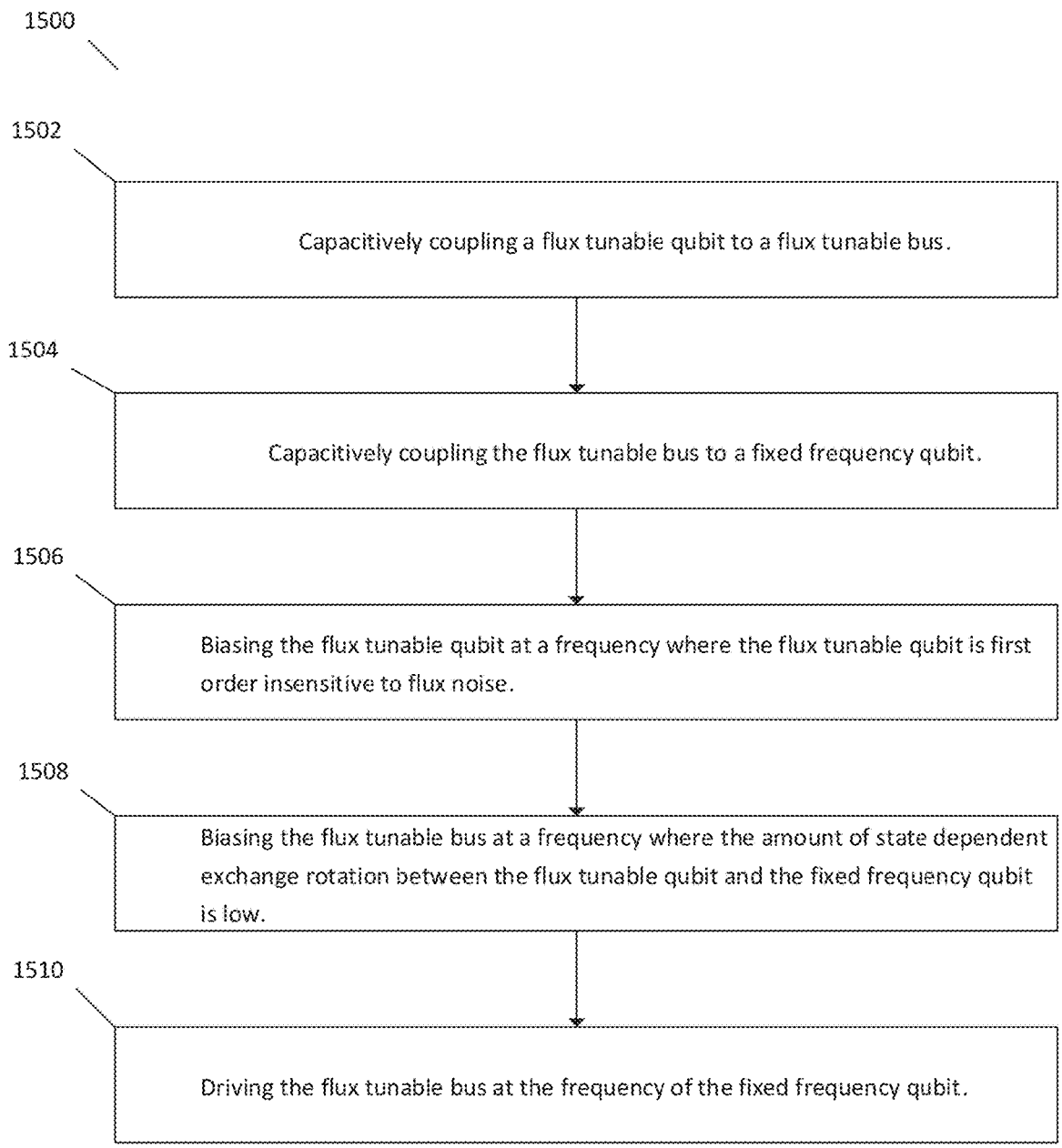
FIG. 15 illustrates a flow diagram of an example, non-limiting method that can facilitate operation of a cross resonance gate with $1^{st}$ order insensitivity to flux noise in accordance with one or more embodiments described herein.

FIG. 15 illustrates a flow diagram of an example, non-limiting method 1500 that can facilitate operation of a cross resonance gate with $1^{st}$ order insensitivity to flux noise in accordance with one or more embodiments described herein. Repetitive description of like elements and/or processes employed in respective embodiments is omitted for sake of brevity.

At 1502, method 1500 can comprise capacitively coupling a flux tunable qubit (e.g., qubit 202) to a flux tunable bus (e.g., flux tunable bus 212).

At 1504, method 1500 can comprise capacitively coupling the flux tunable bus (e.g., flux tunable bus 212) to a fixed frequency qubit (e.g., qubit 222). For example, as described above in reference to FIG. 1, the flux tunable bus can mediate a state dependent exchange rotation between the flux tunable qubit and the fixed frequency qubit. This enables the fixed frequency qubit to act as a data qubit and the flux tunable qubit to act as an ancilla qubit. Additionally, as described above in reference to FIG. 5, multiple flux tunable buses which are coupled to multiple fixed frequency qubits can be coupled to the flux tunable qubit to create multiple gate lattice structures.

At 1506, method 1500 can comprise, biasing (e.g., via controller 204) the flux tunable qubit (e.g., qubit 202) at a frequency where the flux tunable qubit is $1^{st}$ order insensitive to flux noise. For example, as described above in detail in reference to FIGS. 1-2 and 10, the flux tunable qubit has an upper and lower sweet spot where the flux tunable qubit is $1^{st}$ order insensitive to flux noise. The flux tunable qubit can be biased at either the upper sweet spot or the lower sweet spot, based on which one provides fewer gate errors and collisions.

At 1508, method 1500 can comprise, biasing (e.g., via controller 214) the flux tunable bus (e.g., flux tunable bus 212) at a frequency where the amount of state dependent exchange rotation between the flux tunable quit (e.g., qubit 202) and the fixed frequency qubit (e.g., qubit 222) is low. For example, as describe above in reference to FIGS. 8-10, the flux tunable bus can be biased at a frequency where the amount of ZZ between the flux tunable qubit and the fixed frequency qubit is low, but there is still some amount of coupling between the flux tunable qubit and the fixed frequency qubit, measured as J. By lowering the amount of ZZ between the flux tunable qubit the fixed frequency qubit, sensitivity can be decreased, and gate errors reduced. In an embodiment, the bias point for the flux tunable bus can be determined through the use of random benchmarking.

At 1510, method 1500 can comprise, driving (e.g., via controller 204) the flux tunable qubit (e.g., qubit 202) at the frequency of the fixed frequency qubit (e.g., qubit 222). For example, if fixed frequency qubit has a frequency of $f_2$, then the flux tunable qubit can be driven at frequency $f_2$.

In summary, one or more embodiments described herein relate to a quantum computing device that can be tuned in order to operate with low sensitivity and a low rate of gate errors. According to an embodiment, a device comprises a flux tunable qubit capacitively coupled to a flux tunable bus. According to another embodiment, a device comprises a flux tunable qubit capacitively coupled to a flux tunable bus, wherein the flux tunable bus is capacitively coupled to a fixed frequency qubit. According to still another embodiment, a device comprises a flux tunable qubit capacitively coupled to multiple flux tunable buses, wherein the multiple flux tunable buses are capacitively coupled to fixed frequency qubits.

An advantage of such devices can be a quantum computing device that can be tuned to operate as a gate that has a low susceptibility to gate errors. For example, a frequency of the flux tunable qubit can be adjusted until a flux pulse applied to the flux tunable bus coincides with a bias region where the flux tunable bus is $1^{st}$ order insensitive to flux noise, wherein the flux pulse provides a high frequency of the flux tunable bus and the state dependent exchange provides an angle of rotation for a two qubit gate between the flux tunable qubit and the fixed frequency qubit.

In view of the one or more embodiments described herein, a practical application of the devices described herein is the reduction of gate errors and/or increase in qubit coherency. This is a useful and practical application of computers, especially in view of reduction of gate errors and/or other effects on reducing decoherence of employed qubits, and thus facilitating enhanced (e.g., improved) operation of the employed qubits. These enhancements can include increased accuracy of quantum results and/or increased availability of the employed qubits. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a system that can receive as input a quantum job request and can generate as a real-world physical pulse operated on one or more qubits of a quantum system. The one or more physical qubit devices can comprise a device according to the one or more embodiments described herein. The respective quantum system can generate one or more quantum results in response to the performance of the one or more physical operations on the real-world qubits of the quantum system.

The systems and/or devices have been (and/or will be further) described herein with respect to interaction between one or more components. It should be appreciated that such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

It also is to be appreciated that one or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively execute one or more quantum programs in the time that one or more embodiments described herein can facilitate this process. And, neither can the human mind nor a human with pen and paper electronically execute quantum programs as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 16:
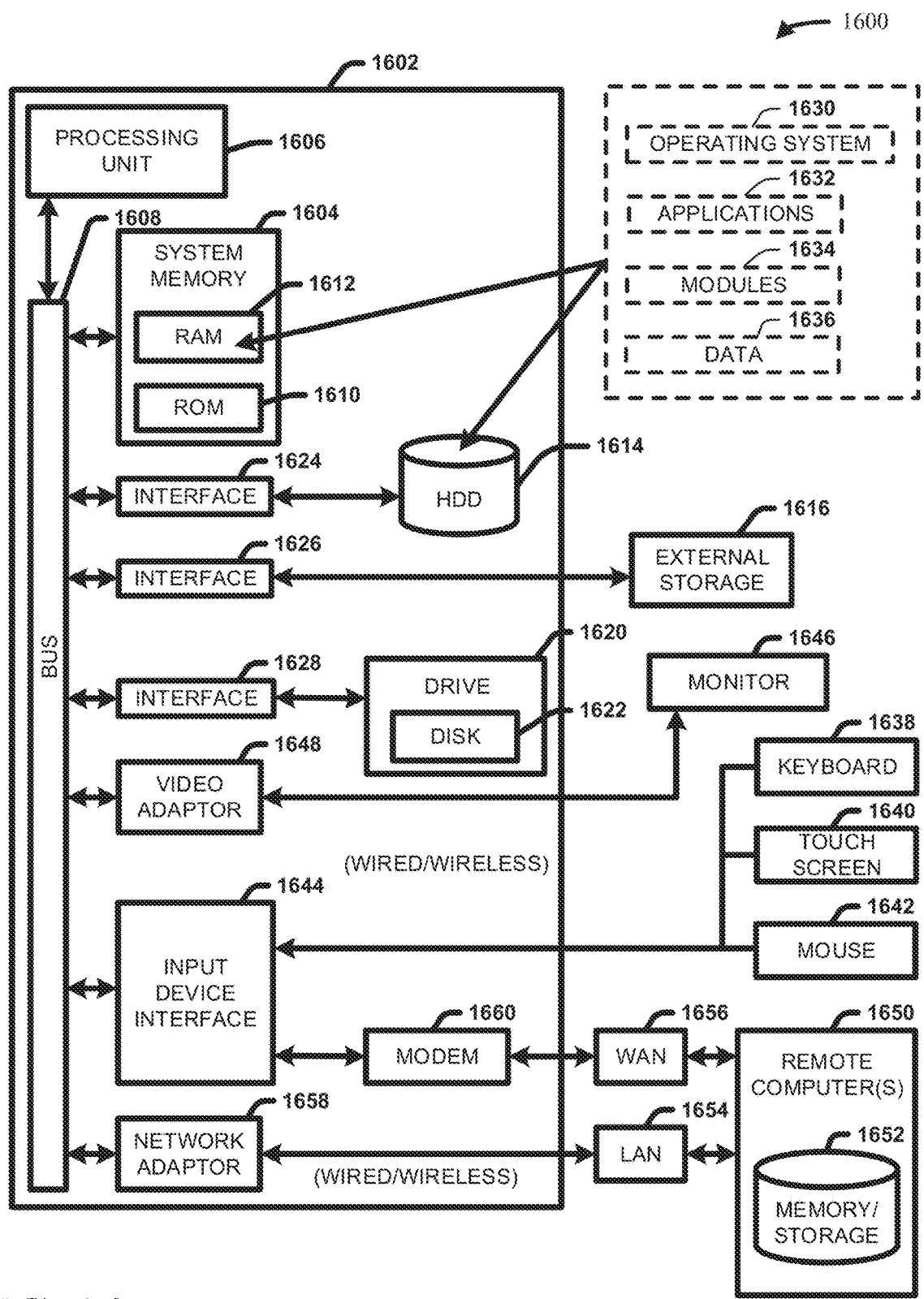
FIG. 16 illustrates a block diagram of an example, non-limiting operating environment in which one or more embodiments described herein can be facilitated.

FIG. 16 and the following discussion are intended to provide a brief, general description of a suitable operating environment 1600 in which one or more embodiments described herein can be implemented. For example, one or more components and/or other aspects of embodiments described herein can be implemented in or be associated with, such as accessible via, the operating environment 1600. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, those skilled in the art will appreciate that the inventive methods can be practiced with other computer system configurations, including single-processor or multi-processor computer systems, minicomputers, mainframe computers, Internet of Things (IoT) devices, distributed computing systems, as well as personal computers, handheld computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 16, the example operating environment 1600 for implementing one or more embodiments of the aspects described herein can include a computer 1602, the computer 1602 including a processing unit 1606, a system memory 1604 and/or a system bus 1608. It will be appreciated that one or more aspects of the processing unit 1606 can be applied to processors such as 106 of the non-limiting system 100. It also will be appreciated that the processing unit 1606 can be implemented in combination with and/or alternatively to processors such as 106.

Memory 1604 can store one or more computer and/or machine readable, writable and/or executable components and/or instructions that, when executed by processing unit 1606 (e.g., a classical processor, a quantum processor and/or like processor), can facilitate performance of operations defined by the executable component(s) and/or instruction (s). For example, memory 1604 can store computer and/or machine readable, writable and/or executable components and/or instructions that, when executed by processing unit 1606, can facilitate execution of the one or more functions described herein relating to non-limiting system 100, as described herein with or without reference to the one or more figures of the one or more embodiments.

Memory 1604 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 1606 can comprise one or more types of processors and/or electronic circuitry (e.g., a classical processor, a quantum processor and/or like processor) that can implement one or more computer and/or machine readable, writable and/or executable components and/or instructions that can be stored at memory 1604. For example, processing unit 1606 can perform one or more operations that can be specified by computer and/or machine readable, writable and/or executable components and/or instructions including, but not limited to, logic, control, input/output (I/O), arithmetic and/or the like. In one or more embodiments, processing unit 1606 can be any of one or more commercially available processors. In one or more embodiments, processing unit 1606 can comprise one or more central processing unit, multi-core processor, microprocessor, dual microprocessors, microcontroller, System on a Chip (SOC), array processor, vector processor, quantum processor and/or another type of processor. The examples of processing unit 1606 can be employed to implement one or more embodiments described herein.

The system bus 1608 can couple system components including, but not limited to, the system memory 1604 to the processing unit 1606. The system bus 1608 can comprise one or more types of bus structure that can further interconnect to a memory bus (with or without a memory controller), a peripheral bus and/or a local bus using one or more of a variety of commercially available bus architectures. The system memory 1604 can include ROM 1610 and/or RAM 1612. A basic input/output system (BIOS) can be stored in a non-volatile memory such as ROM, erasable programmable read only memory (EPROM) and/or EEPROM, which BIOS contains the basic routines that help to transfer information among elements within the computer 1602, such as during startup. The RAM 1612 can include a high-speed RAM, such as static RAM for caching data.

The computer 1602 can include an internal hard disk drive (HDD) 1614 (e.g., EIDE, SATA), one or more external storage devices 1616 (e.g., a magnetic floppy disk drive (FDD), a memory stick or flash drive reader, a memory card reader and/or the like) and/or a drive 1620, e.g., such as a solid state drive or an optical disk drive, which can read or write from a disk 1622, such as a CD-ROM disc, a DVD, a BD and/or the like. Additionally, and/or alternatively, where a solid state drive is involved, disk 1622 could not be included, unless separate. While the internal HDD 1614 is illustrated as located within the computer 1602, the internal HDD 1614 can also be configured for external use in a suitable chassis (not shown). Additionally, while not shown in operating environment 1600, a solid state drive (SSD) can be used in addition to, or in place of, an HDD 1614. The HDD 1614, external storage device(s) 1616 and drive 1620 can be connected to the system bus 1608 by an HDD interface 1624, an external storage interface 1626 and a drive interface 1628, respectively. The HDD interface 1624 for external drive implementations can include at least one or both of Universal Serial Bus (USB) and Institute of Electrical and Electronics Engineers (IEEE) 1694 interface technologies. Other external drive connection technologies are within contemplation of the embodiments described herein.

The drives and their associated computer-readable storage media provide nonvolatile storage of data, data structures, computer-executable instructions, and so forth. For the computer 1602, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 1612, including an operating system 1630, one or more applications 1632, other program modules 1634 and/or program data 1636. All or portions of the operating system, applications, modules and/or data can also be cached in the RAM 1612. The systems and/or methods described herein can be implemented utilizing one or more commercially available operating systems and/or combinations of operating systems.

Computer 1602 can optionally comprise emulation technologies. For example, a hypervisor (not shown) or other intermediary can emulate a hardware environment for operating system 1630, and the emulated hardware can optionally be different from the hardware illustrated in FIG. 16. In a related embodiment, operating system 1630 can comprise one virtual machine (VM) of multiple VMs hosted at computer 1602. Furthermore, operating system 1630 can provide runtime environments, such as the JAVA runtime environment or the .NET framework, for applications 1632. Runtime environments are consistent execution environments that can allow applications 1632 to run on any operating system that includes the runtime environment. Similarly, operating system 1630 can support containers, and applications 1632 can be in the form of containers, which are lightweight, standalone, executable packages of software that include, e.g., code, runtime, system tools, system libraries and/or settings for an application.

Further, computer 1602 can be enabled with a security module, such as a trusted processing module (TPM). For instance, with a TPM, boot components hash next in time boot components and wait for a match of results to secured values before loading a next boot component. This process can take place at any layer in the code execution stack of computer 1602, e.g., applied at application execution level and/or at operating system (OS) kernel level, thereby enabling security at any level of code execution.

An entity can enter and/or transmit commands and/or information into the computer 1602 through one or more wired/wireless input devices, e.g., a keyboard 1638, a touch screen 1640 and/or a pointing device, such as a mouse 1642. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera (s), a gesture sensor input device, a vision movement sensor input device, an emotion or facial detection device, a biometric input device, e.g., fingerprint and/or iris scanner, and/or the like. These and other input devices can be connected to the processing unit 1606 through an input device interface 1644 that can be coupled to the system bus 1608, but can be connected by other interfaces, such as a parallel port, an IEEE 1694 serial port, a game port, a USB port, an IR interface, a BLUETOOTH® interface and/or the like.

A monitor 1646 or other type of display device can be alternatively and/or additionally connected to the system bus 1608 via an interface, such as a video adapter 1648. In addition to the monitor 1646, a computer typically includes other peripheral output devices (not shown), such as speakers, printers and/or the like.

The computer 1602 can operate in a networked environment using logical connections via wired and/or wireless communications to one or more remote computers, such as a remote computer(s) 1650. The remote computer(s) 1650 can be a workstation, a server computer, a router, a personal computer, portable computer, microprocessor-based entertainment appliance, a peer device and/or other common network node, and typically includes many or all of the elements described relative to the computer 1602, although, for purposes of brevity, only a memory/storage device 1652 is illustrated. Additionally, and/or alternatively, the computer 1602 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 1654 and/or larger networks, e.g., a wide area network (WAN) 1656. LAN and WAN networking environments can be commonplace in offices and companies and can facilitate enterprise-wide computer networks, such as intranets, all of which can connect to a global communications network, e.g., the Internet.

When used in a LAN networking environment, the computer 1602 can be connected to the local network 1654 through a wired and/or wireless communication network interface or adapter 1658. The adapter 1658 can facilitate wired and/or wireless communication to the LAN 1654, which can also include a wireless access point (AP) disposed thereon for communicating with the adapter 1658 in a wireless mode.

When used in a WAN networking environment, the computer 1602 can include a modem 1660 and/or can be connected to a communications server on the WAN 1656 via other means for establishing communications over the WAN 1656, such as by way of the Internet. The modem 1660, which can be internal and/or external and a wired and/or wireless device, can be connected to the system bus 1608 via the input device interface 1644. In a networked environment, program modules depicted relative to the computer 1602 or portions thereof can be stored in the remote memory/storage device 1652. It will be appreciated that the network connections shown are merely exemplary and one or more other means of establishing a communications link among the computers can be used.

When used in either a LAN or WAN networking environment, the computer 1602 can access cloud storage systems or other network-based storage systems in addition to, and/or in place of, external storage devices 1616 as described above, such as but not limited to, a network virtual machine providing one or more aspects of storage and/or processing of information. Generally, a connection between the computer 1602 and a cloud storage system can be established over a LAN 1654 or WAN 1656 e.g., by the adapter 1658 or modem 1660, respectively. Upon connecting the computer 1602 to an associated cloud storage system, the external storage interface 1626 can, such as with the aid of the adapter 1658 and/or modem 1660, manage storage provided by the cloud storage system as it would other types of external storage. For instance, the external storage interface 1626 can be configured to provide access to cloud storage sources as if those sources were physically connected to the computer 1602.

The computer 1602 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a pre-defined structure as with a conventional network or simply an ad hoc communication between at least two devices.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, those skilled in the art will appreciate that the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

The claims and scope of the subject application, and any continuation, divisional or continuation-in-part applications claiming priority to the subject application, exclude embodiments (e.g., systems, apparatus, methodologies, computer program products and computer readable storage media) directed to implanted electrical stimulation for pain treatment and/or management.

What is claimed is:

1. A device, comprising:
   a flux tunable qubit capacitively coupled to a flux tunable bus, wherein the flux tunable bus is capacitively coupled to a fixed frequency qubit;
   a first controller than biases the flux tunable qubit at a first frequency where the flux tunable qubit is 1st order insensitive to flux noise; and
   a second controller that biases the flux tunable bus at a second frequency where an amount of state dependent exchange rotation between the flux tunable qubit and the fixed frequency qubit satisfies a defined criterion, and modulates the flux tunable bus at a third frequency equal to an energy difference between qubit states $|10\rangle - |01\rangle$ of the flux tunable qubit and the fixed frequency qubit.

2. The device of claim 1, wherein the fixed frequency qubit is a first fixed frequency qubit, and further comprising:
   a second flux tunable bus capacitively coupled to the flux tunable qubit, wherein the second flux tunable bus is capacitively coupled to a second fixed frequency qubit and the second fixed frequency qubit has a different frequency than the flux tunable qubit.

3. The device of claim 1, wherein a frequency of the flux tunable qubit is above a frequency of the flux tunable bus and below a frequency of the fixed frequency qubit.

4. The device of claim 1, wherein the second controller further modulates the flux tunable bus at a fourth frequency equal to an energy difference between qubit states $|11\rangle - |02\rangle$ or $|11\rangle - |20\rangle$ of the flux tunable qubit and the fixed frequency qubit.

5. The device of claim 1, wherein the defined criterion is a first defined criterion, and wherein the first controller adjusts a frequency of the flux tunable qubit until a flux pulse applied to the flux tunable bus by the second controller coincides with a bias region where the flux tunable bus is 1st order insensitive to flux noise, wherein the flux pulse provides a defined high frequency of the flux tunable bus that satisfies a second defined criterion, and the state dependent exchange rotation provides an angle of rotation for a two qubit gate between the flux tunable qubit and the fixed frequency qubit.

6. The device of claim 5, wherein the second defined criterion is a defined upper sweet spot of the flux tunable bus.

7. The device of claim 1, wherein the defined criterion is a defined lower sweet spot of the flux tunable bus.

8. A system, comprising:
a quantum computing device, comprising:
a flux tunable qubit capacitively coupled to a flux tunable bus, wherein the flux tunable bus is capacitively coupled to a fixed frequency qubit;
a first controller than biases the flux tunable qubit at a first frequency where the flux tunable qubit is 1st order insensitive to flux noise; and
a second controller that biases the flux tunable bus at a second frequency where an amount of state dependent exchange rotation between the flux tunable qubit and the fixed frequency qubit satisfies a defined criterion, and modulates the flux tunable bus at a third frequency equal to a first energy difference $|10\rangle - |01\rangle$ of the flux tunable qubit and the fixed frequency qubit.

9. The system of claim 8, wherein the flux tunable bus mediates the state dependent exchange rotation between the flux tunable qubit and the fixed frequency qubit.

10. The system of claim 8, wherein a frequency of the flux tunable qubit is above a frequency of the flux tunable bus and below a frequency of the fixed frequency qubit.

11. The system of claim 8, wherein the second controller further modulates the flux tunable bus at a fourth frequency equal to a second energy difference between qubit states $|11\rangle - |02\rangle$ or $|11\rangle - |20\rangle$ of the flux tunable qubit and the fixed frequency qubit.

12. The system of claim 8, wherein the defined criterion is a first defined criterion, and wherein the first controller adjusts a frequency of the flux tunable qubit until a flux pulse applied to the flux tunable bus by the second controller coincides with a bias region where the flux tunable bus is 1st order insensitive to flux noise, wherein the flux pulse provides a defined high frequency of the flux tunable bus that satisfies a second defined criterion, and the state dependent exchange rotation provides an angle of rotation for a two qubit gate between the flux tunable qubit and the fixed frequency qubit.

13. The system of claim 12, wherein the second defined criterion is a defined upper sweet spot of the flux tunable bus, and wherein the first defined criterion is a defined lower sweet spot of the flux tunable bus.

14. A method, comprising:
capacitively coupling a flux tunable qubit to a flux tunable bus;
capacitively coupling the flux tunable bus to a fixed frequency qubit; and
biasing the flux tunable qubit and the flux tunable bus, wherein biasing the flux tunable qubit and the flux tunable bus comprises:
biasing the flux tunable qubit at a first frequency where the flux tunable qubit is 1st order insensitive to flux noise, and
biasing the flux tunable bus at a second frequency where an amount of state dependent exchange rotation between the flux tunable qubit and the fixed frequency qubit satisfies a defined criterion; and
modulating the flux tunable bus at a third frequency equal to a first energy difference between qubit states $|10\rangle - |01\rangle$ of the flux tunable qubit and the fixed frequency qubit.

15. The method of claim 14, further comprising:
mediating the state dependent exchange rotation between the flux tunable qubit and the fixed frequency qubit using the flux tunable bus.

16. The method of claim 14, wherein a frequency of the flux tunable qubit is above a frequency of the flux tunable bus and below a frequency of the fixed frequency qubit.

17. The method of claim 14, wherein the defined criterion is a first defined criterion, and wherein biasing the flux tunable qubit and the flux tunable bus comprises:
adjusting a frequency of the flux tunable qubit until a flux pulse applied to the flux tunable bus coincides with a bias region where the flux tunable bus is 1st order insensitive to flux noise, wherein the flux pulse provides defined high frequency of the flux tunable bus that satisfies a second defined criterion, and the state dependent exchange rotation provides an angle of rotation for a two qubit gate between the flux tunable qubit and the fixed frequency qubit.

18. The method of claim 17, wherein the second defined criterion is a defined upper sweet spot of the flux tunable bus.

19. The method of claim 14, further comprising:
modulating the flux tunable bus at a fourth frequency equal to a second energy difference between qubit states $|11\rangle - |02\rangle$ or $|11\rangle - |20\rangle$ of the flux tunable qubit and the fixed frequency qubit.

20. The method of claim 14, wherein the defined criterion is a defined lower sweet spot of the flux tunable bus.

* * * * *